United States Patent
Rinaldi et al.

(10) Patent No.: US 9,419,583 B2
(45) Date of Patent: Aug. 16, 2016

(54) NANO- AND MICRO-ELECTROMECHANICAL RESONATORS

(71) Applicant: Northeastern University, Boston, MA (US)

(72) Inventors: Matteo Rinaldi, Boston, MA (US); Cristian Cassella, East Boston, MA (US); Zhenyun Qian, Boston, MA (US); Yu Hui, Malden, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 14/969,948

(22) Filed: Dec. 15, 2015

(65) Prior Publication Data

US 2016/0099701 A1    Apr. 7, 2016

Related U.S. Application Data

(63) Continuation-in-part of application No. 14/784,876, filed as application No. PCT/US2014/035015 on Apr. 22, 2014.

(60) Provisional application No. 62/132,755, filed on Mar. 13, 2015, provisional application No. 62/213,876, filed on Sep. 3, 2015, provisional application No. 61/814,742, filed on Apr. 22, 2013, provisional application No. 61/814,744, filed on Apr. 22, 2013, provisional application No. 61/828,227, filed on May 29, 2013.

(51) Int. Cl.
*H03H 9/02* (2006.01)
*H03H 9/13* (2006.01)
*H03H 9/15* (2006.01)
*G01J 5/20* (2006.01)
*G01J 5/58* (2006.01)

(52) U.S. Cl.
CPC ............. *H03H 9/02244* (2013.01); *G01J 5/20* (2013.01); *G01J 5/58* (2013.01); *H03H 9/13* (2013.01); *H03H 9/15* (2013.01)

(58) Field of Classification Search
CPC .......... G01J 5/20; G01J 5/58; H03H 9/02244; H03H 9/13; H03H 9/15
See application file for complete search history.

(56) References Cited

U.S. PATENT DOCUMENTS

| | | |
|---|---|---|
| 6,046,530 A | 4/2000 | Funaki |
| 2006/0017523 A1 | 1/2006 | Bhave et al. |

(Continued)

OTHER PUBLICATIONS

Piazza, G. "MEMS Resonator for Frequency Control and Sensing Applications." Joint Conference of the IEEE International Frequency Control Symposium and European Frequency and Time Forum, San Francisco, CA, May 1-5, 2011.

(Continued)

*Primary Examiner* — Mark R Gaworecki
(74) *Attorney, Agent, or Firm* — Posternak Blankstein & Lund LLP

(57) ABSTRACT

A resonator includes a piezoelectric plate and interdigitated electrode(s). The interdigitated electrode includes a plurality of conductive strips disposed over a top surface of the piezoelectric plate. A two-dimensional mode of mechanical vibration is excited in a cross sectional plane of the piezoelectric plate in response to an alternating voltage applied through the interdigitated electrode. The two-dimensional mode of mechanical vibration is a cross-sectional Lamé mode resonance (CLMR) or a degenerate cross-sectional Lamé mode resonance (dCLMR).

25 Claims, 27 Drawing Sheets

(56) References Cited

U.S. PATENT DOCUMENTS

| | | |
|---|---|---|
| 2012/0274410 A1 | 11/2012 | Koyama |
| 2013/0083044 A1 | 4/2013 | Zuo et al. |
| 2013/0147320 A1 | 6/2013 | Son et al. |

OTHER PUBLICATIONS

Hui et al., "Ultra-fast and high resolution NEMS thermal detector based on a nano-air-gap piezoelectric resonant structure," Electrical and Computer Engineering Faculty Publications, Northeastern University, Oct. 28, 2012.

Hui, Y.; Rinaldi, M., "High performance NEMS resonant infrared detector based on an aluminum nitride nano-plate resonator," in Solid-State Sensors, Actuators and Microsystems (Transducers & Eurosensors XXVII), The 17th International Conference on Transducers & Eurosensors XXVII: pp. 968-971, Jun. 16-20, 2013.

International Search Report & Written Opinion on PCT/US2014/035015 dated Feb. 13, 2015.

Gerfers, Friedel, et al. Sputtered AlN thin films for piezoelectric MEMS devices-FBAR resonators and accelerometers. INTECH Open Access Publisher, 2010.

Bhuyan, M. S., et al. "Investigation on MEMS-based piezoelectric energy harvester design with aspect of autonomous automobile sensors." Asian Journal of Scientific Research 6.1 (2013): 1.

Zheludev, Nikolay I., and Yuri S. Kivshar. "From metamaterials to metadevices." Nature materials 11.11 (2012): 917-924.

Qian, Zhiming, et al. "245 MHz graphene-aluminum nitride nano plate resonator." Solid-State Sensors, Actuators and Microsystems (Transducers & Eurosensors XXVII), 2013 Transducers & Eurosensors XXVII: The 17th International Conference on. IEEE, 2013.

Rinaldi, Matteo, Chiara Zuniga, and Gianluca Piazza. "5-10 GHz AlN contour-mode nanoelectromechanical resonators." Micro Electro Mechanical Systems, 2009. MEMS 2009. IEEE 22nd International Conference on. IEEE, 2009.

Hui, Yu, Zhenyun Qian, and Matteo Rinaldi. "A 2.8 GHz combined mode of vibration aluminum nitride MEMS resonator with high figure of merit exceeding 45." European Frequency and Time Forum & International Frequency Control Symposium (EFTF/IFC), 2013 Joint. IEEE, 2013.

Qian, Zhenyun, et al. "Single transistor oscillator based on a Graphene-Aluminum Nitride nano plate resonator." European Frequency and Time Forum & International Frequency Control Symposium (EFTF/IFC), 2013 Joint. IEEE, 2013.

Zuo, Chengjie, Jan Van der Spiegel, and Gianluca Piazza. "Dual-mode resonator and switchless reconfigurable oscillator based on piezoelectric AlN MEMS technology." Electron Devices, IEEE Transactions on 58.10 (2011): 3599-3603.

NANO- AND MICRO-ELECTROMECHANICAL RESONATORS

RELATED APPLICATIONS

This application is a continuation in part of U.S. application Ser. No. 14/784,876, filed Oct. 15, 2015, which claims priority to PCT Application Serial No. PCT/US 2014/035015, filed Apr. 22, 2014, which claims priority to U.S. Provisional Application Ser. No. 61/814,742, filed Apr. 22, 2013; U.S. Provisional Application Ser. No. 61/814,744, filed Apr. 22, 2013; and U.S. Provisional Application Ser. No. 61/828,227, filed May 29, 2013, each of which is hereby incorporated by reference in its entirety. This application also claims priority to U.S. Provisional Application Ser. No. 62/132,755, filed Mar. 13, 2015, which is hereby incorporated by reference in its entirety. This application also claims priority to U.S. Provisional Application Ser. No. 62/213,876, filed Sep. 3, 2015, which is hereby incorporated by reference in its entirety.

STATEMENT REGARDING FEDERALLY SPONSORED RESEARCH

This invention was made with government support under Grant No. N66001-12-1-4221, awarded by the DARPA Young Faculty Award, Grant No. DARPA-N66001-14-1-4011 awarded by the DARPA, and Grant No. ECCS-1350114 awarded by the NSF CAREER Award. The United States government has certain rights in this invention.

BACKGROUND

Micro Electro Mechanical (MEM) resonators are key enablers for the development of miniaturized and low-power multi-band radio-frequency (RF) systems capable of operating in the crowded modern commercial and military spectral environment. The use of micro- and nano-electromechanical systems to form low-loss passive filters presents challenges as a result of their still low Figure of Merit. Because of this reason, pre-existing resonator technologies, such as Surface Acoustic Wave (SAW), are still preferred despite the impossibility of monolithically integrating them on the same chip than the rest of the electronic components.

SUMMARY

In view of the foregoing, the present Inventors have recognized and appreciated the advantages of a resonator with the features described herein to be employed in future RF components including micro- and nano-electromechanical systems.

In one embodiment, a resonator includes a piezoelectric plate having a length direction, a width direction, and a thickness direction, and a first interdigitated electrode including a plurality of conductive strips disposed over a top surface of the piezoelectric plate. The top surface extends along the length direction and the width direction. Each conductive strip has an electrode width substantially along the width direction. The plurality conductive strips are arranged with a pitch substantially along the width direction. A two-dimensional mode of mechanical vibration is excited in a cross sectional plane of the piezoelectric plate in response to an alternating voltage applied through the first interdigitated electrodes. The cross sectional plane extends along the width direction and the thickness direction.

In another embodiment, the two-dimensional mode of mechanical vibration is a cross-sectional Lamé mode of vibration in which a peak-to-peak displacement along the width direction is the same as a peak-to-peak displacement along the thickness direction.

In another embodiment, the two-dimensional mode of mechanical vibration is a degenerate cross-sectional Lamé mode of vibration in which a peak-to-peak displacement along the width direction is different from a peak-to-peak displacement along the thickness direction.

In another embodiment, the resonator further includes a second interdigitated electrode including a plurality of conductive strips disposed over a bottom surface of the piezoelectric plate. The bottom surface extends along the length direction and the width direction. The two-dimensional mode of mechanical vibration is excited in the cross sectional plane in response to the alternating voltage applied through the first interdigitated electrode and the second interdigitated electrode.

Provided in another embodiment is an infrared (IR) resonator. The IR detector includes a plasmonic piezoelectric resonator comprising a piezoelectric plate, an interdigitated electrode disposed over a bottom surface of the piezoelectric plate, and a nanoplasmonic metasurface disposed over a top surface of the piezoelectric plate. The interdigitated electrode includes a plurality of conductive strips arranged with a pitch. The nanoplasmonic metasurface has a pattern arranged to facilitate selective absorption of infrared (IR).

In another embodiment, the IR resonator further includes two tethers supporting the plasmonic piezoelectric resonator and electrically connecting to the interdigitated electrode.

In another embodiment, the pattern of the nanoplasmonic metasurface includes a plurality of unit cells.

Provided In another embodiment is gravimetric sensor comprising a nano-scale resonator. The nano-scale resonator includes a piezoelectric nano-plate with a thickness in a range of about 10 nm to about 100 μm, and an interdigitated electrode disposed over a top surface of the piezoelectric nano-plate. The interdigitated electrode includes a plurality of nano-strips arranged with a pitch in a range of about 10 nm to about 100 μm. A two dimensional mode of mechanical vibration is excited in the piezoelectric nano-plate in response to an alternating voltage applied through the interdigitated electrode. A resonance frequency of the vibration shifts in response to mass loaded on the piezoelectric nano-plate.

In another embodiment, the gravimetric sensor further includes single walled carbon nanotubes (SWNTs) grown on the nano-scale resonator and decorated with single stranded DNAs.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Figures 1A, 1B:
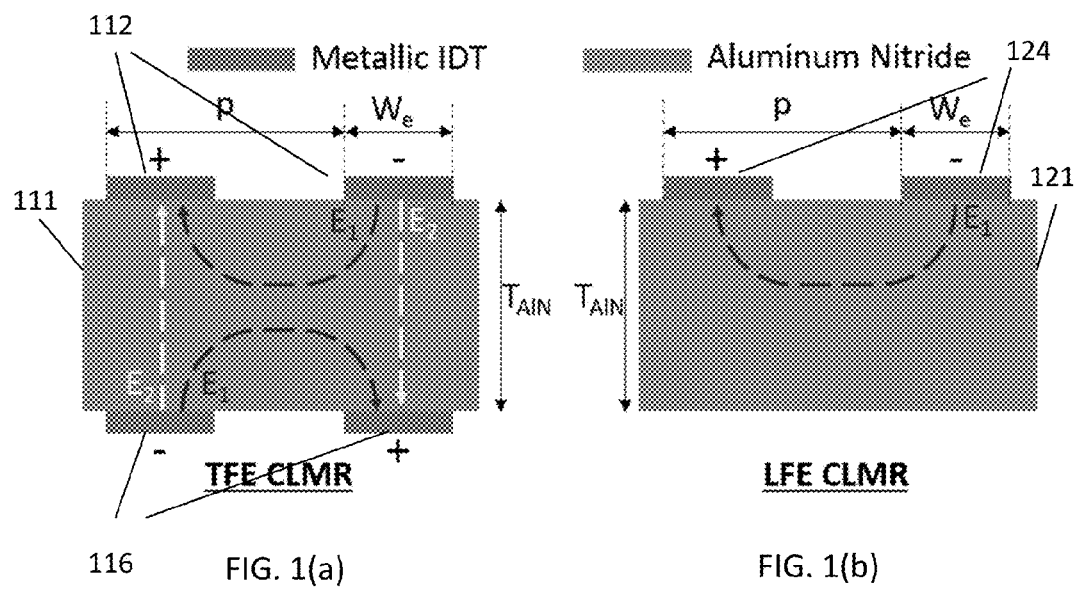
FIG. 1(a) is a schematic representation of thickness field excitation (TFE) for cross-sectional Lamé mode resonators (CLMRs) and degenerate cross-sectional Lamé mode resonators (dCLMRs), according to one embodiment.
FIG. 1(b) is a schematic representation of lateral field excitation (LFE) for CLMRs and dCLMRs, according to one embodiment.

Following below are more detailed descriptions of various concepts related to, and embodiments of, micro-electromechanical resonators and methods of producing the same. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Aluminum Nitride Resonators

MEM resonators have been researched for their ability to attain high quality factors (Q) and large electromechanical coupling coefficients ($k_t^2$) in small volumes, thereby achieving desirable Figure of Merit. As used herein, $k_t^2$ is a measure of the conversion efficiency between electrical and acoustic energy in piezoelectric materials; Figure of merit is the product of the quality factor (Q) and $k_t^2$. The Figure of Merit may directly determine the motional resistance in a resonator, impact oscillator design by setting the required gain (i.e., power consumption) and phase noise of oscillator, and impact filter design by setting insertion loss in properly terminated filters and device bandwidth.

Aluminum Nitride (AlN) Film-Bulk-Acoustic resonators (FBAR) can replace off-chip surface acoustic wave (SAW) devices in commercial products, hence significantly reducing the form-factor of the RF front-ends. The AlN FBAR technology relies on the $e_{33}$ piezoelectric coefficient of AlN to transduce resonant vibration along the thickness of an AlN plate. Since the device resonance frequency ($f_r$) is set by the thickness of the AlN plate ($T_{AlN}$), the resonance frequency cannot be tuned lithographically. Thus, integration of multi-frequency FBAR based filters on a same chip may increase the fabrication complexity (i.e., by mass-loading or trimming).

AlN contour-mode resonator (CMR) technology allows lithographical tuning of the resonance frequency. The AlN CMR relies on the $e_{31}$ piezoelectric coefficient of AlN to transduce resonant vibration along an in-plane direction of an AlN plate (e.g., width extensional or length extensional motion). The lithographically set lateral dimension of the device determines the resonance frequency of the device. Therefore, CMRs operating in the Ultra-High-(UHF) and Very-High-(VHF) frequency ranges can be fabricated on a same chip. However, the electromechanical coupling coefficient ($k_t^2$) of AlN CMRs is lower than that of FBARs due to the intrinsically lower amplitude of the $e_{31}$ piezoelectric coefficient compared to the $e_{33}$. Thus, FBAR-based filters are still preferred to the CMR-based ones for the implementation of low insertion loss and wideband passive filtering networks.

Cross-Sectional Lamé Mode Resonators

Resonators disclosed herein are a new class of AlN MEM resonators based on the piezoelectric transduction of a Lamé mode or a degenerate Lamé mode in the cross-section of an AlN plate, called cross-sectional Lamé mode resonators (CLMRs) or degenerate cross-sectional Lamé mode resonators (dCLMRs). The CLMRs and dCLMRs rely on a coherent combination of the $e_{31}$ and $e_{33}$ piezoelectric coefficients of AlN to transduce a two dimensional (2D) mechanical mode of vibration, which is characterized by longitudinal vibrations along both the width and the thickness of the AlN plate. For the CLMRs, the peak-to-peak displacement along the width direction is the same as the peak-to-peak displacement along the thickness directions. For the dCLMRs, the peak-to-peak displacements along the width direction and the thickness direction are different. CLMRs and dCLMRs can achieve high values of electromechanical coupling coefficient, for example, as high as 7%. In addition, since such a 2D mode of vibration depends on the lateral dimensions of the plate, CLMRs/dCLMRs operating at different resonance frequencies can be lithographically defined on a same substrate without requiring additional fabrication steps. Thus, both high electromechanical coupling coefficient and integration of multi-frequency and low insertion-loss filters on a same chip can be achieved without additional costs and fabrication complexity.

Referring to FIG. 1(a), a schematic representation of thickness field excitation (TFE) for CLMR/dCLMR is shown, according to one embodiment. The CLMR/dCLMR may be part of nano-electromechanical or micro-electromechanical based RF systems to be used for applications such as sensing and communication. The TFE CLMR/dCLMR in FIG. 1(a) includes a piezoelectric plate 111, a top interdigitated electrode 112 disposed on a top surface of the plate 111, and a bottom interdigitated electrode 116 disposed on a bottom surface of the plate 111. The plate 111 may have any suitable dimensions. Depending on the geometry of the resonator, the term "dimension" may refer to any dimension of interest in the resonator. For example, the dimension may refer to thickness, width, height, length, diameter, radius, etc. According to one embodiment, the plate may have a thickness of less than or equal to about 10 microns—e.g., less than about 9 microns, about 8 microns, about 7 microns, about 6 microns, about 5 microns, about 4 microns, about 3 microns, about 2 microns, about 1 micron, about 900 nm, about 800 nm, about 700 nm, about 600 nm, about 500 nm, about 400 nm, about 300 nm, about 200 nm, about 100 nm, or less. According to another embodiment, the plate is a nano-plate, referring to a plate whose largest dimension is in the nanometer range, such as less than or equal to about 1 micron, or any of the aforedescribed values with respect to dimension. According to another embodiment, nano-plate may refer to a plate with at least one dimension in the nanometer range, such as less than or equal to about 1 micron, or any of the aforedescribed values with respect to dimension. According to another embodiment, the plate is a micro-plate, referring to a plate whose largest dimension is in the micrometer range, such as less than or equal to about 1 mm. According to another embodiment, micro-plate may refer to a plate with at least one dimension in the micrometer range, such as less than or equal to about 1 mm.

The plate 111 may be made of any suitable piezoelectric material. According to one embodiment, the plate 111 may include a compound, such as a nitride, such as an aluminum nitride (AlN). According to another embodiment, the plate may include at least one of aluminum nitride, lithium niobate, lithium tantalate, zinc oxide, gallium nitride, scandium nitride, and quartz.

The top electrode 112 and the bottom electrode 116 of the resonator may be made of any suitable material. According to one embodiment, the electrodes 112 and 116 may include a metal, such as a noble metal, such as platinum or gold. In some embodiments, the top electrode 112 and the bottom electrode 116 are in direct contact with the piezoelectric plate 111. In some embodiments, at least one of the top electrode 112 and the bottom electrode 116 is not in directed contact with the piezoelectric plate 111. The top electrode 112 may include multiple conductive strips, each strip having a width $W_e$ and arranged with a pitch p from adjacent strips (i.e., p is the combination of the width of a strip and the width of the space between two adjacent strips). The bottom electrode 116 has an identical pattern as the top electrode 112. As shown, two electric field components can be excited simultaneously, $E_1$ along the lateral direction and $E_2$ along the thickness direction. $E_1$ has field lines connecting adjacent conductive strips forming the top interdigitated electrode 112. $E_2$ has field lines connecting two conductive strips facing each other, one conductive strip from the top interdigitated electrode 112 and the other from the bottom interdigitated electrode 116.

Referring to FIG. 1(b), a schematic representation of lateral field excitation (LFE) for CLMR/dCLMR is shown, according to one embodiment. The LFE CLMR/dCLMR in FIG. 1(b) includes a piezoelectric plate 121 and a top interdigitated electrode 124 disposed on a top surface of the plate 121. The plate 121 is similar to the plate 111 of FIG. 1(a). The top electrode 124 is similar to the top electrode 112 of FIG. 1(a). Different than the TFE CLMR/dCLMR, the LFE CLMR/dCLMR does not include a bottom electrode. Therefore, electrical field component $E_1$ along the lateral direction can be excited but not electrical field component along the thickness direction. As will be discussed in greater detail below, LFE CLMR/dCLMR may simplify the fabrication of the device at the expense of a lower $k_t^2$, comparing to TFE CLMR/dCLMR. Experiments demonstrated a $k_t^2$ of about 2.5% and a quality factor Q of about 1900 for a LFE CLMR/dCLMR operating at 2.8 GHz, resulting in a $k_t^2Q$ product (i.e. Figure of Merit (FoM)) close to 46.

Principle of Operation of Cross-Sectional Lamé Mode Resonators (CLMRs)

When an alternating voltage is applied to the interdigitated electrode(s), a cross-sectional Lamé mode of vibration may be excited in the resonators shown in FIG. 1. Starting from the equations of motion in solids, the Lamb wave theory can identify all modes of vibration that can be described by a one dimensional (1D) displacement vector in a plate. Thus, the modes of vibration can be characterized by a predominant displacement along one geometrical dimension of the plate, whose size determines the frequency of operation. Different from 1D modes of vibration, CLMRs/dCLMR shows comparable displacements along two dimensions, for example, displacement along the lateral direction ($\widetilde{\mu_x}$) and displacement along the thickness direction ($\widetilde{\mu_z}$) of the plate 111 or 121 of FIG. 1. For the CLMRs, the peak-to-peak displacement along the lateral direction is the same as the peak-to-peak displacement along the thickness directions. For the dCLMRs, the peak-to-peak displacements along the lateral direction and the thickness direction are different. Equation (1) is the general expression of displacements along the lateral ($\widetilde{\mu_x}$) and thickness ($\widetilde{\mu_z}$) directions for the CLMR:

$$\begin{bmatrix} \widetilde{u_x} \\ \widetilde{u_z} \end{bmatrix} = \begin{bmatrix} A(x) & B(z) \\ C(x) & D(z) \end{bmatrix} = \begin{bmatrix} \cos(\beta_x x) & \sin(\beta_z z) \\ -\sin(\beta_x x) & \cos(\beta_z z) \end{bmatrix}, \quad (1)$$

wherein $\beta_x$ and $\beta_z$ are the wave-vectors relative to the motion along the x- and z-directions.

The resonance frequency ($f_r$) of the CLMR can be obtained by solving the equations of motion (Equations (2) and (3)), which describe the distribution of the x-($\mu_x$) and z-displacements ($\mu_z$) in an AlN plate, with proper boundary conditions.

$$C_{11}\frac{d''(\mu_x)}{dx^2} + C_{55}\frac{d''(\mu_x)}{dz^2} + 2C_{15}\frac{d''(\mu_x)}{dxdz} + (C_{55}+C_{13})\frac{d''(\mu_z)}{dxdz} = \rho \cdot (2\pi f_r)^2 \cdot \mu_x, \quad (2)$$

$$C_{15}\frac{d''(\mu_x)}{dx^2} + C_{55}\frac{d''(\mu_z)}{dz^2} + C_{33}\frac{d''(\mu_z)}{dz^2} + (C_{55}+C_{13})\frac{d''(\mu_x)}{dxdz} = \rho \cdot (2\pi f_r)^2 \cdot \mu_z, \quad (3)$$

wherein $C_{ij}$ are components of the stiffness matrix of the piezoelectric material of which the plate is made (e.g., AlN) and $\rho$ is the mass density of the piezoelectric material.

By setting $\mu_x$ and $\mu_z$ in Equations (2) and (3) to $\widetilde{\mu_x}$ and $\widetilde{\mu_z}$ in Equation (1), respectively, Equations (2) and (3) are simplified as:

$$C_{11}\beta_x^2 - (C_{13}+C_{55})\beta_x\beta_z + C_{55}\beta_z^2 = \rho \cdot (2\pi f_r)^2 \quad (4)$$

$$C_{33}\beta_z^2 - (C_{13}+C_{55})\beta_x\beta_z + C_{55}\beta_x^2 = \rho \cdot (2\pi f_r)^2 \quad (5).$$

Equations (4) and (5) have four sets of ($\widetilde{\beta_x}$, $\widetilde{\beta_z}$) solution, but only one set corresponds to positive wave-vectors along both vibrational directions, hence enabling the excitation of the cross-sectional Lamé mode (CLM) in the resonator. The set of ($\widetilde{\beta_x}$, $\widetilde{\beta_z}$) is:

$$\beta_x = \sqrt{\frac{B\rho(2\pi f_r)^2}{C_{11}C_{33} - C_{55}^2 + \sqrt{AB}}}, \quad (6)$$

$$\beta_z = \beta_x \sqrt{\frac{(C_{11}-C_{55})}{(C_{33}-C_{55})}}, \quad (7)$$

wherein $A=(C_{11}-C_{55})(C_{13}+C_{55})^2$ and $B=(C_{33}-C_{55})$.

All sides of AlN CLMRs behave as stress-free boundaries. Thus, $\widetilde{\beta_x}$ and $\widetilde{\beta_z}$ satisfy the following boundary conditions:

$$\beta_x = \frac{n \cdot \pi}{W_{AlN}}, \quad (8)$$

$$\beta_z = \frac{m \cdot \pi}{T_{AlN}}, \quad (9)$$

wherein n is the mode number along the x-direction, m is the mode number along the z-directions, $W_{AlN}$ is the width of the AlN plate, which is equivalent to n·p (See FIG. 1), and $T_{AlN}$ is the thickness of the AlN plate. Analysis below discusses the vibration mode with the minimum vibrational order allowed by both TFE and LFE CLMRs (i.e. n equal to 2 and m equal to 1). In this scenario, $W_{AlN}$ coincides with the acoustic wavelength along the x-direction ($\lambda_x$), and $\lambda_x$=2p.

By comparing Equation (8) and Equation (6), the resonance frequency, $f_r$, of the CLMR is:

$$f_r = \frac{1}{\lambda_x}\sqrt{\frac{C_{11}C_{33} - C_{55}^2 - (C_{13}+C_{55})\sqrt{(C_{11}-C_{55})(C_{33}-C_{55})}}{(C_{33}-C_{55})\rho}}. \quad (10)$$

By combining Equations (7) through (9), the following $\lambda_x/T_{AlN}$ ratio should be satisfied in order to enable excitation of the CLM in the AlN plate:

$$\frac{\lambda_x}{T_{AlN}} = 2\sqrt{\frac{(C_{11}-C_{55})}{(C_{33}-C_{55})}}. \quad (11)$$

Figure 2:
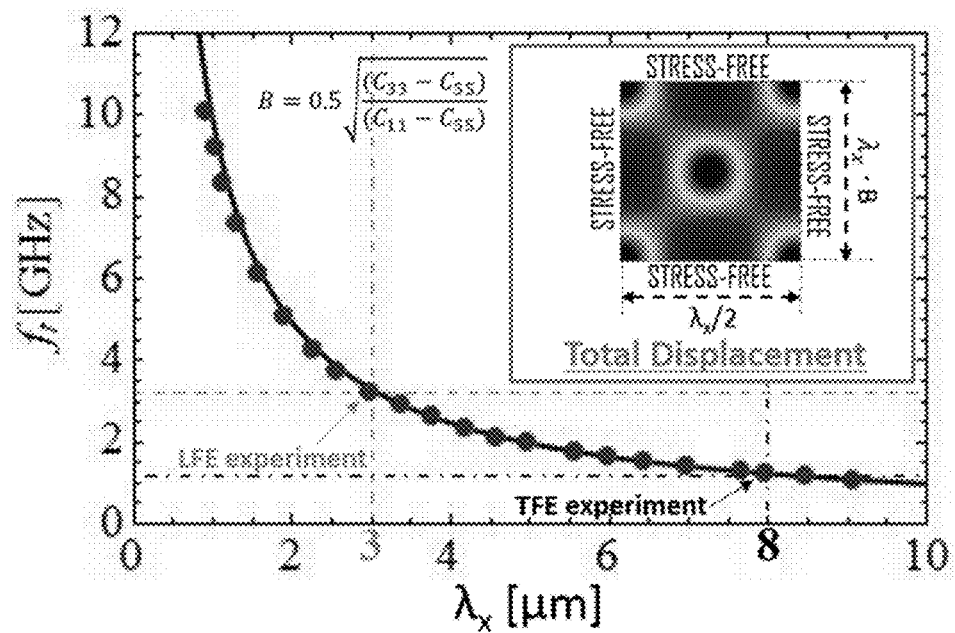
FIG. 2 depicts the distribution of the resonance frequency ($f_r$) of a CLMR as a function of the acoustic wavelength along the lateral direction ($\lambda_x$), according to one embodiment.

FIG. 2 illustrates the distribution of the resonance frequency $f_r$ as a function of the acoustic wavelength $\lambda_x$. The curve in FIG. 2 represents the analytically found distribution; the dots represent the simulated $f_r$ value through finite element analysis (FEA) as $\lambda_x$ varies between 1 and 10 μm. $T_{AlN}$ has been adjusted, for each $\lambda_x$ value, to satisfy Equation (11). FIG. 2 also shows the geometry used to compute $f_r$ and the two $\lambda_x$ values experimentally explored (i.e., $\lambda_x$=3 μm for the "LFE experiment" and $\lambda_x$=8 μm for the "TFE experiment"). The analytically found distribution of $f_r$ with respect to $\lambda_x$ shows excellent agreement with the simulated trend through FEA.

Figure 3:
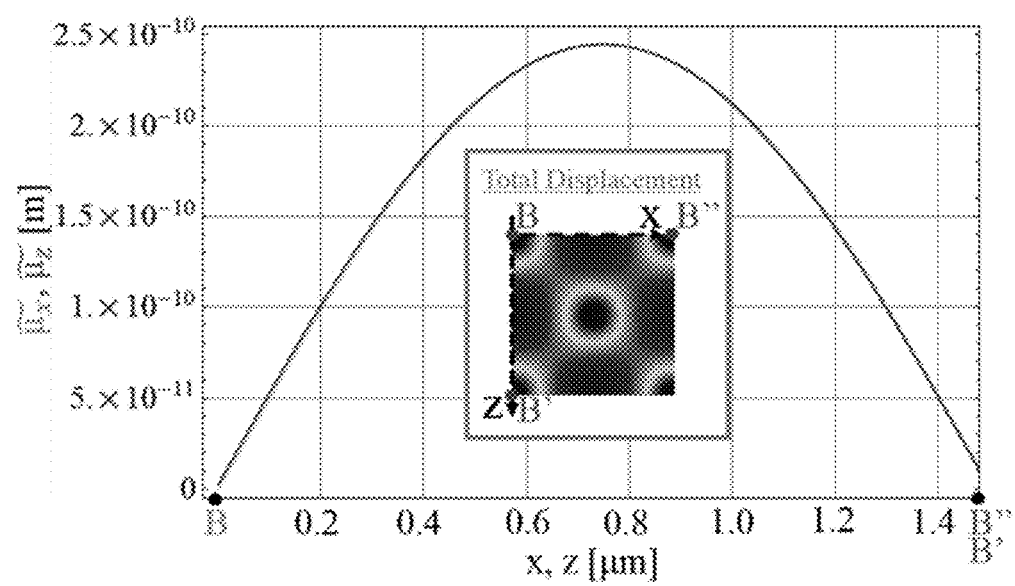
FIG. 3 depicts distributions of displacements $\widetilde{\mu_x}$ and $\widetilde{\mu_z}$ simulated through finite element analysis (FEA) along cut lines (BB' and BB'') in the cross-section of a CLMR.

FIG. 3 depicts distributions of $\widetilde{\mu_x}$ and $\widetilde{\mu_z}$ simulated through FEA along cut lines (BB' and BB") in the cross-section of a CLMR. In the simulation, a $W_{AlN}$ of 1.5 μm (mode number n=1) is used and a resonator quality factor Q of 2500 is assumed. The displacement reaches the maximum at (x,z)=(0.75 μm, 0.75 μm). As expected, for CLMR, the simulated distributions of $\widetilde{\mu_x}$ and $\widetilde{\mu_z}$ show the same peak-to-peak value (See Equation (1)) along cut lines BB' and BB".

The resonator may be configured to resonate at any appropriate frequency. According to one embodiment, the resonator resonates at a frequency of at least about 10 MHz, e.g., at least about 50 MHz, about 100 MHz, about 200 MHz, about 300 MHz, about 400 MHz, about 500 MHz, about 600 MHz, about 700 MHz, about 800 MHz, about 900 MHz, or higher. According to another embodiment, the resonator resonates at a frequency of about 10 MHz to about 100 GHz, e.g., about 50 MHz to about 90 GHz, about 100 MHz to about 80 GHz, about 200 MHz to about 70 GHz, about 300 MHz to about 60 GHz, about 400 MHz to about 50 GHz, etc.

Electromechanical Coupling Coefficient of CLMRs

For MEM piezoelectric resonators, piezoelectric coupling constant ($K^2$) identifies the maximum electromechanical coupling coefficient ($k_t^2$) for a specific mode of vibration. $k_t^2$ is a measure of the conversion efficiency between electrical and acoustic energy in piezoelectric resonators. In particular, $k_t^2$ represents the portion of the electrical energy, stored in the resonator's static capacitance ($C_0$), which is converted into mechanical motion (i.e., proportional to the ratio between motional and static capacitances, $C_m/C_0$). $k_t^2$ of a resonator can be directly extracted from its electrical response as:

$$k_t^2 = \frac{\pi^2}{8} \frac{f_p^2 - f_s^2}{f_s^2} = \frac{\pi^2}{8} \frac{C_m}{C_0}, \qquad (12)$$

wherein $f_p$ is the parallel resonance frequency, and $f_s$ is the series resonance frequency of the resonator.

The $K^2$ of a first order CLMR (i.e., fundamental Cross-Sectional Lamé mode of vibration, n and m both equal to 1) can be analytically derived as discussed below. Since CLMRs displace along both lateral and thickness directions, their piezoelectric coupling coefficient is the sum of two components. One component ($K_x^2$) is produced by the lateral motion (i.e., $\widetilde{\mu_x}$) whereas the second component ($K_z^2$) is originated from the thickness vibration (i.e., $\widetilde{\mu_z}$). Since the electric field is exclusively distributed across the thickness of the AlN plate (z-oriented), the $K^2$ associated with each of the two displacement components of the CLM can be computed by solving its corresponding Christoffel equation. The so found $K^2$ value ($K_{Chr}^2$) is an effective measure of the actual piezoelectric coupling coefficient if the mode-shape is uniform along the directions orthogonal to the vibrational one. In this scenario, $K_{eff}^2$ can be approximated as:

$$K_{eff}^2 = K_{Chr}^2 \int_{-T/2}^{T/2} B(z) dz \qquad (13),$$

If the resonator were to displace along the x-direction, with displacement distribution, $\mu_x$, not uniform along the z-direction (i.e. $\mu_x = \cos(\beta_x x) \cdot B(z)$), its effective $K^2$ ($K_{eff}^2$) would be lower than $K_{Chr}^2$. In the CLM case where $\widetilde{\mu_x}$ and $\widetilde{\mu_z}$ are not uniform along thickness and width of the AlN plate, $K_x^2$ and $K_z^2$ are computed as:

$$K_x^2 = \frac{K_{Chr[x]}^2}{T} \int_0^T \sin(\beta_z z) dz = \frac{2}{\pi} K_{Chr[x]}^2, \qquad (14)$$

$$K_z^2 = \frac{K_{Chr[z]}^2}{p} \int_0^p \sin(\beta_x x) dx = \frac{2}{\pi} K_{Chr[z]}^2, \qquad (15)$$

wherein $K_{Chr[x]}^2$ and $K_{Chr[z]}^2$ are the piezoelectric coupling coefficients derived from Christoffel equation, respectively, for the lateral and vertical longitudinal vibration components of the CLM.

$K_{Chr[x]}^2$ and $K_{Chr[z]}^2$ are computed as:

$$K_{Chr[x]}^2 = \frac{e_{31}^2}{\varepsilon \cdot C_{lat}}, \qquad (16)$$

$$K_{Chr[z]}^2 = \frac{e_{33}^2}{\varepsilon \cdot C_{thic}} = \frac{e_{33}^2}{\varepsilon \cdot C_{lat}} \sqrt{\frac{(C_{11} - C_{55})}{(C_{33} - C_{55})}}, \qquad (17)$$

wherein $C_{lat}$ is the effective stiffness coefficients of the CLMR along the x-direction, $C_{thic}$ is the effective stiffness coefficient of CLMRs along the z-directions, $e_{31}$ is an AlN piezoelectric coefficient equal to $-0.58$ C/m$^2$, $e_{33}$ is another AlN piezoelectric coefficient equal to $1.55$ C/m$^2$, and $\varepsilon$ is the AlN dielectric permittivity.

Applying Equations (6) and (7), $C_{lat}$ and $C_{thic}$ are:

$$C_{lat} = \qquad (18)$$
$$\frac{C_{11} C_{33} - C_{55}^2}{(C_{33} - C_{55})} + \frac{(C_{13} + C_{55})\sqrt{(C_{11} - C_{55})(C_{33} - C_{55})}}{(C_{33} - C_{55})} = 320 \text{ GPa},$$

$$C_{thic} = C_{lat} \frac{(C_{33} - C_{55})}{(C_{11} - C_{55})} = 300 \text{ GPa}. \qquad (19)$$

Therefore, for CLMs excited in AlN plates, $K^2$ ($K_{CLM}^2$) is:

$$K_{CLM}^2 = \frac{2}{\pi}(K_{Chr[x]}^2 + K_{Chr[z]}^2) = 7.1\%. \qquad (20)$$

Figure 4:
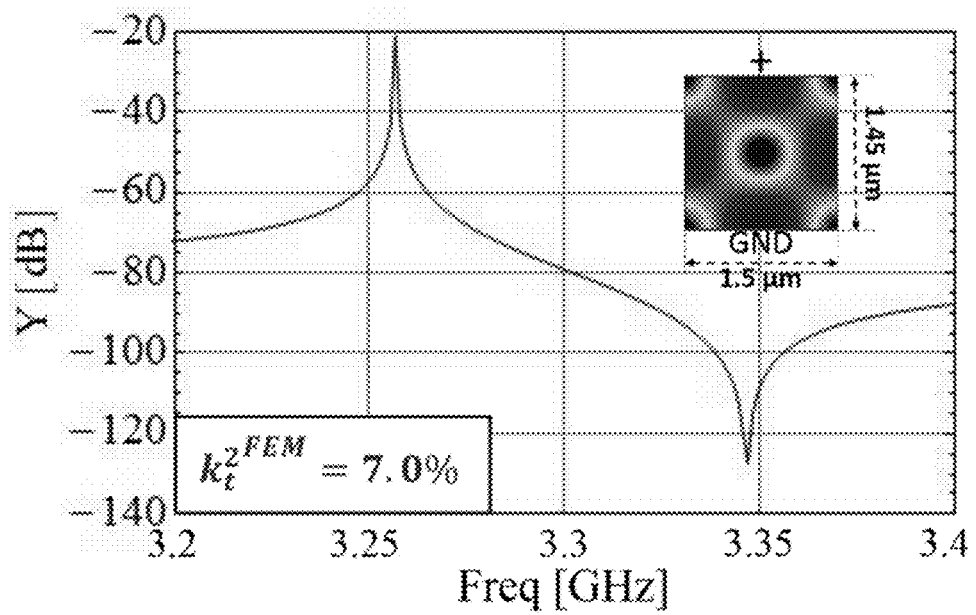
FIG. 4 depicts piezoelectric coupling coefficient $k_t^{2^{FEM}}$ simulated through two-dimensional FEA, according to one embodiment.

The $K_{CLM}^2$ value obtained from Equation (20) can be verified by the piezoelectric coupling coefficient $k_t^2$, which is extracted from its simulated admittance (See Equation (12)), through 2D-Finite Element Analysis (FEA), as shown in FIG. 4. A schematic representation of the specific CLMR geometry used in the simulation is also shown in FIG. 4. In particular, a CLMR characterized by a $W_{AlN}$ of 1.5 µm and a $T_{AlN}$ of 1.45 µm (See Equation (11)) is used. A resonator length (L) equal to 50 µm and no damping is assumed. In addition, the presence of the IDTs is neglected by exciting the devices through infinitesimal excitation boundaries. As evident from A schematic representation of the specific CLMR geometry used in the simulation is also shown in FIG. 4., the FEM computed electromechanical coupling coefficient $k_t^{2^{FEM}}$, closely matches the value derived through the simplified analytical model (See Equation (20)). The validity of Equation (20) is hence confirmed.

A comparison between $t^{2^{FEM}}$ and the previously reported $K^2$ values for AlN FBARs and AlN CMRs is shown in Table 1.

TABLE 1

Comparison of piezoelectric coupling coefficient of different types.

| Technology | $K^2$ |
| --- | --- |
| AlN FBARs | 7% |
| AlN CMRs | 2% |
| AlN CLMRs | 6.4% |

A. Higher-Order CLMs in AlN Thin Plates

The performance of a first order CLMR (i.e., fundamental Cross-Sectional Lamé mode of vibration, n and m both equal to 1) is discussed above. In order to reach small values of input impedance, piezoelectric resonators often recur to higher-order vibrational modes (i.e. n>1) excited through the use of conductive interdigitated structures (IDTs). For a conventional $S_0$ mode Lamb-wave, the pitch of the IDTs used to excite the $S_0$ mode Lamb-wave resonators may define the acoustic wavelength and, consequently, the frequency of operation. However, when higher order CLMs are excited in AlN plates, the resonance frequency and electromechanical performance depend on both $\lambda_x$ and $T_{AlN}$ (See Equation (11)). In particular, when the resonance frequency of the Lamb-wave $S_0$ mode propagating along the lateral direction (i.e. x)

matches the resonance frequency of the longitudinal mode propagating along the thickness direction (i.e. z), a large electromechanical coupling coefficient can be expected through the excitation of a CLM in the AlN plate. This phenomenon can be studied, through Finite Element Analysis, by extracting $k_t^{2^{FEM}}$ of the $S_0$ mode for different $T_{AlN}/\lambda_x$ values and for a representative set of n-values. This can be done through the identification, for each investigated case, of the metallized ($f_m$) and the non-metallized ($f_o$) frequencies. Once $f_m$ and $f_o$ are found, $k_t^{2^{FEM}}$ can be obtained through Equation (12) by replacing $f_s$ with $f_m$ and $f_p$ with $f_o$.

Figure 5:
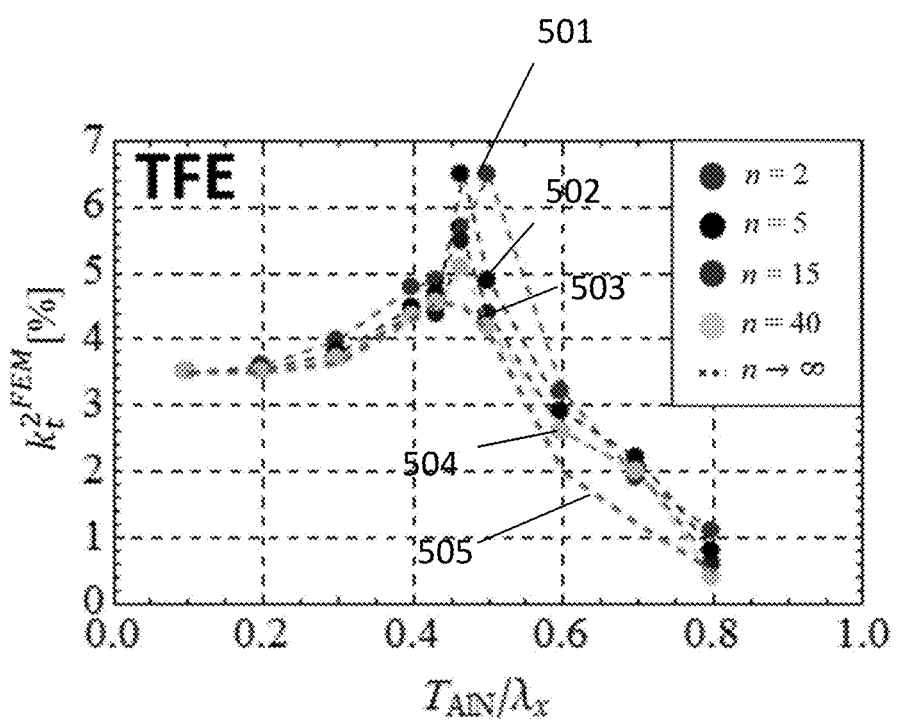
FIG. 5 depicts $k_t^{2^{FEM}}$ for TFE CLMRs of different $T_{AlN}/\lambda_x$ and mode number n values, according to one embodiment.

Referring to FIG. 5, $k_t^{2^{FEM}}$ according to Equation (12) for TFE CLMRs of different $T_{AlN}/\lambda_x$ and n values is shown. In calculating $k_t^{2^{FEM}}$, the presence of the metallic IDTs is neglected. Curve 501 corresponds to $k_t^{2^{FEM}}$ changing with $T_{AlN}/\lambda_x$ for mode number n=2; curve 502 for n=5; curve 503 for n=15, curve 504 for n=40; and curve 505 for n→∞. In simulating the case related to n→∞, periodic boundary conditions are applied to both displacement and electric fields, at the lateral edges of a second order CLMR (i.e., $W_{AlN}=\lambda_x$).

Figure 6:
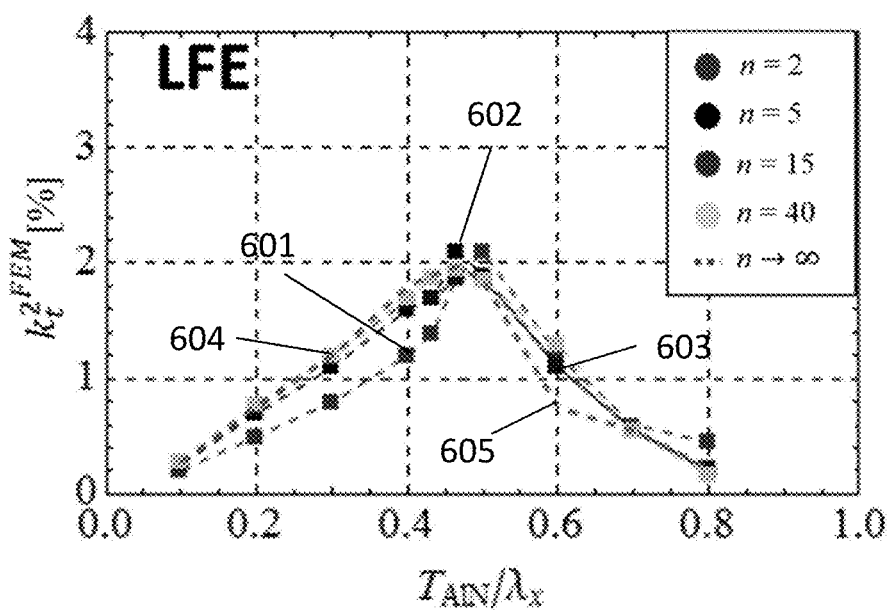
FIG. 6 depicts $k_t^{2^{FEM}}$ for LFE CLMRs of different $T_{AlN}/\lambda_x$ and mode number n values, according to one embodiment.

Referring to FIG. 6, $k_t^{2^{FEM}}$ according to Equation (12) for LFE CLMRs of different $T_{AlN}/\lambda_x$ and n values is shown. In calculating $k_t^{2^{FEM}}$, the presence of the metallic IDTs is neglected. Curve 601 corresponds to $k_t^{2^{FEM}}$ changing with $T_{AlN}/\lambda_x$ for mode number n=2; curve 602 for n=5; curve 603 for n=15, curve 604 for n=40; and curve 605 for n→∞. In simulating the case related to n→∞, periodic boundary conditions are applied to both displacement and electric fields, at the lateral edges of a second order CLMR (i.e., $W_{AlN}=\lambda_x$).

As shown, a maximum $k_t^{2^{FEM}}$ value ($k_t^{2^{max}}$) is found at a $T_{AlN}/\lambda_x$ that approaches the optimum value (~0.5) enabling the excitation of a CLM in the AlN plate (See Equation (11)), for both the TFE and the LFE.

For the case of TFE shown in FIG. 5, $k_t^{2^{max}}$ reduces as n increases. This reduction originates from the increase of the parasitic capacitance produced by the lateral component of the modal distribution of the electric field. In particular, $k_t^2$ for a higher-order vibrational mode (N), $k_t^{2^{n=N}}$, can be related to $k_t^2$ for n equal to 1, $k_t^{2^{n=1}}$. The relationship between $k_t^{2^{n=N}}$ and $k_t^{2^{n=1}}$ is as follows.

$$k_t^{2^{n=N}} \propto \frac{N \cdot C_m^{n=1}}{C_0^{n=N}} = \frac{N \cdot C_m^{n=1}}{N \cdot C_0^v + (N-1) \cdot C_0^l} = k_t^{2^{n=1}} \cdot \frac{1}{1 + \frac{C_0^{lat} \cdot (N-1)}{N \cdot C_0^v}}, \quad (21)$$

wherein $C_m^{n=1}$ is the resonator motional capacitance when n is equal to 1, $C_0^{n=N}$ is the resonator static capacitance when n is set to N, $C_0^v$ and $C_0^{Lat}$ are the capacitances associated with the electric field modal distributions along the thickness and lateral directions, respectively. According to Equation (21), the negative impact of $C_0^{Lat}$ on the device kt2 is minimum when N is equal to 1 and reaches maximum when N approaches infinity. In particular, when N→∞, $k_t^{2^{n=N}}$ can be rewritten as:

$$k_t^{2^{N \to \infty}} \propto k_t^{2^{n=1}} \cdot \frac{C_0^v}{C_0^v + C_0^{Lat}}. \quad (22)$$

It is worth noting that the value of $C_0^{Lat}$ depends on $T_{AlN}/\lambda_x$. In particular, $C_0^{Lat}$ is minimum for $T_{AlN}/\lambda_x \to 0$ while increases for larger $T_{AlN}/\lambda_x$ values.

Nevertheless, when $T_{AlN}/\lambda_x \to 0.5$, $C_0^{Lat}$ is still smaller than $C_0^v$. Therefore, boosting of the $k_t^2$ associated with the excitation of the CLM in the structure is not significantly compromised. In addition, the $T_{AlN}/\lambda_x$ value at which the $k_t^2$ value reaches the maximum slightly lowers when n is increased. This may be due to the different sensitivity of $C_{lat}$ and $C_{thic}$ to $C_0^{Lat}$, which originates, in piezoelectric plates, from the different piezoelectric coefficients involved in the motion along the lateral and thickness directions.

For the case of LFE shown in FIG. 6, a much lower sensitivity of $k_t^{2^{FEM}}$ with respect to n is found. This is mostly due to the fact that $C_0^{Lat}$ remains significantly larger than $C_0^v$ for all $T_{AlN}/\lambda_x$ values and is independent of n.

Degenerate Cross-Sectional Lamé Mode Resonators (dCLMRs)

As discussed above, CLMRs/dCLMRs have displacements along two dimensions, for example, displacement along the lateral direction ($\widetilde{\mu_x}$) and displacement along the thickness direction ($\widetilde{\mu_z}$) of the piezoelectric plate. For CLMRs, the peak-to-peak displacement along the lateral direction is the same as the peak-to-peak displacement along the thickness directions. For dCLMRs, the peak-to-peak displacements along the lateral direction and the thickness direction are different.

CLM excitation can be enabled when the ratio of acoustic wavelength to the thickness of the piezoelectric plate ($\lambda_x/T_{AlN}$) satisfies Equation (11). For the minimum vibrational order, the acoustic wavelength is two times the pitch of the interdigitated electrode(s) (i.e., $\lambda_x=2p$). For dCLMRs, the ratio of the acoustic wavelength (i.e., the pitch of the interdigitated electrode(s)) to the thickness of the piezoelectric plate no longer satisfies Equation (11). dCLMRs can be formed by stationary motion along the thickness and lateral directions of the plate and are possible for a much wider range of $T_{AlN}/\lambda_x$ values. The mode degeneracy is enabled by the special dispersive properties of AlN that allow the lateral coupling of each conductive strip of the IDTs that vibrates along the thickness direction. When the coupling happens, stationary waves occur along both directions of the plate and consequently, the electromechanical performance and resonance frequency depend on the motion along both directions.

Equation (10) shows that as the value of acoustic wavelength (i.e., the pitch) changes, the resonance frequency would change accordingly. Thus, the dCLMRs may achieve various resonance frequencies by varying the pitch of the interdigitated electrode(s) in lithographic processes without the need to change the thickness of the piezoelectric plate. As discussed in greater detail below, it is possible for dCLMRs to achieve $k_t^2$ values that are comparable to the best $k_t^2$ values attained in the non-degenerate CLMRs in a broad range of lithographically defined operating frequencies (i.e., different $\lambda_x$-values for a given $T_{AlN}$). Thus, it is possible to use dCLMRs to achieve, simultaneously, high $k_t^2$ and a lithographic tunability of $f_r$.

As discussed above, The mode degeneracy is enabled by the special dispersive properties of AlN that allow the lateral coupling of each conductive strip of the IDTs that vibrates along the thickness direction. The dispersion equation for two-dimensional modes of vibration relates the wave-vectors relative to both directions (See Equations (8) and (9)) to the resonance frequency as follows:

$$\frac{f_r}{v_{eq}} = \sqrt{\widetilde{\beta_x}^2 + \widetilde{\beta_y}^2}, \tag{23}$$

wherein $v_{req}$ is an equivalent sound velocity for the two-dimensional motion. Equation (23) can be used to describe the resonance frequency, $f_r$, of degenerate CLMRs as a function of $\lambda_x$. To do so, $v_{eq}$ is calculated. $v_{eq}$ can be estimated as $$v_{eq} \sim \sqrt{\frac{2C_{thic}}{4\rho}}$$

if the small difference of sound velocities relative to the motion along the two directions is neglected. $f_r$ in Equation (23) may be set equal to the resonance frequency of non-degenerate CLMRs in Equation (10). Although Equation (10) is obtained for CLMRs in which Equation (11) is strictly satisfied. The validity of such approximation is valid for dCLMRs because the difference between $C_{lat}$ and $C_{thic}$ is small (See Equations (18) and (19)). Assuming that $v_{eq}$ is almost independent of $$\frac{T_{AlN}}{\lambda_x}$$

for a limited range of $$\frac{T_{AlN}}{\lambda_x}$$

values around the optimum (~0.5), $f_r$ can be calculated as:

$$f_r \approx \frac{1}{2T_{AlN}} \cdot \sqrt{1 + \left(\frac{2T_{AlN}}{\lambda_x}\right)^2} \cdot \sqrt{\frac{2C_{thic}}{4\rho}}. \tag{24}$$

Figure 7:
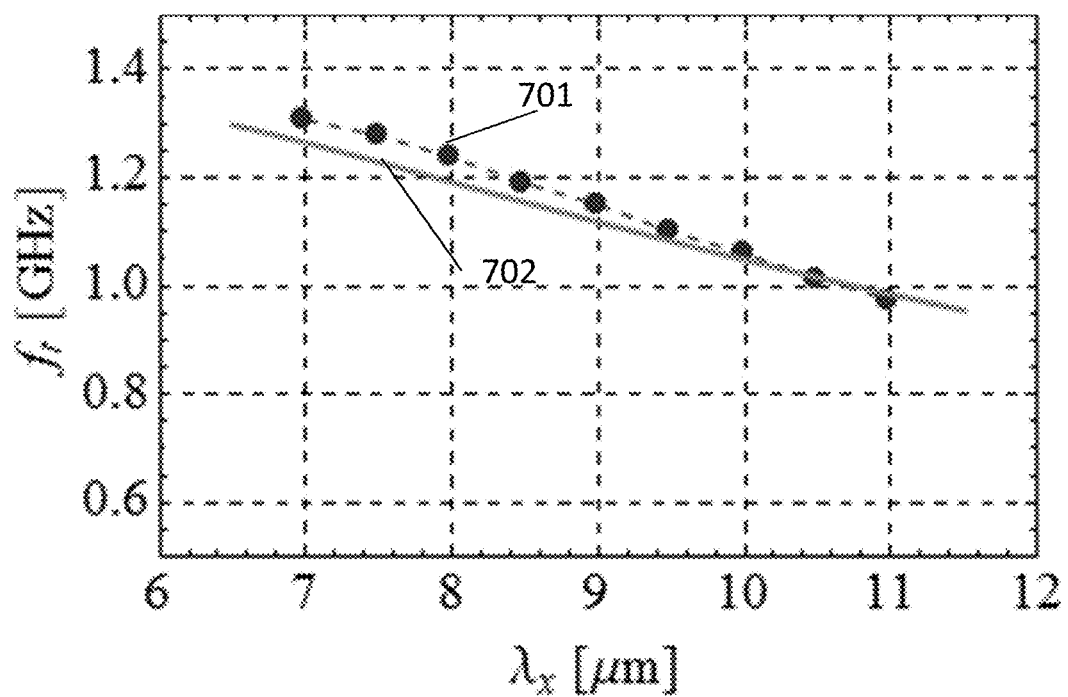
FIG. 7 compares resonance frequencies $f_r$ simulated through FEA with resonance frequencies obtained analytically for TFE dCLMRs, as the acoustic wavelength varies, according to one embodiment.

Referring to FIG. 7, resonance frequencies $f_r$ simulated through FEA is compared with resonance frequencies obtained analytically for TFE dCLMRs, as the acoustic wavelength $\lambda_x$ varies. Curve 701 represents the simulated $f_r$, and curve 702 represents the analytical $f_r$ with the presence of interdigitated electrode(s) neglected in both approaches. The thickness of the AlN plate ($T_{AlN}$) is 4 μm, which is the same value as used in the TFE experiment in FIG. 2. $\lambda_x$ varies between about 7 μm and about 11 μm. It can be seen from FIG. 7 that the analytical $f_r$ closely matches the simulated $f_r$. FIG. 7 also shows that degenerate TFE CLMRs achieve a lithographic frequency shift of ~350 MHz around 1.2 GHz by varying $\lambda_x$ from about 7 μm to about 11 μm. Such variation does not lead to substantial decrease of $k_t^2$.

Figure 8:
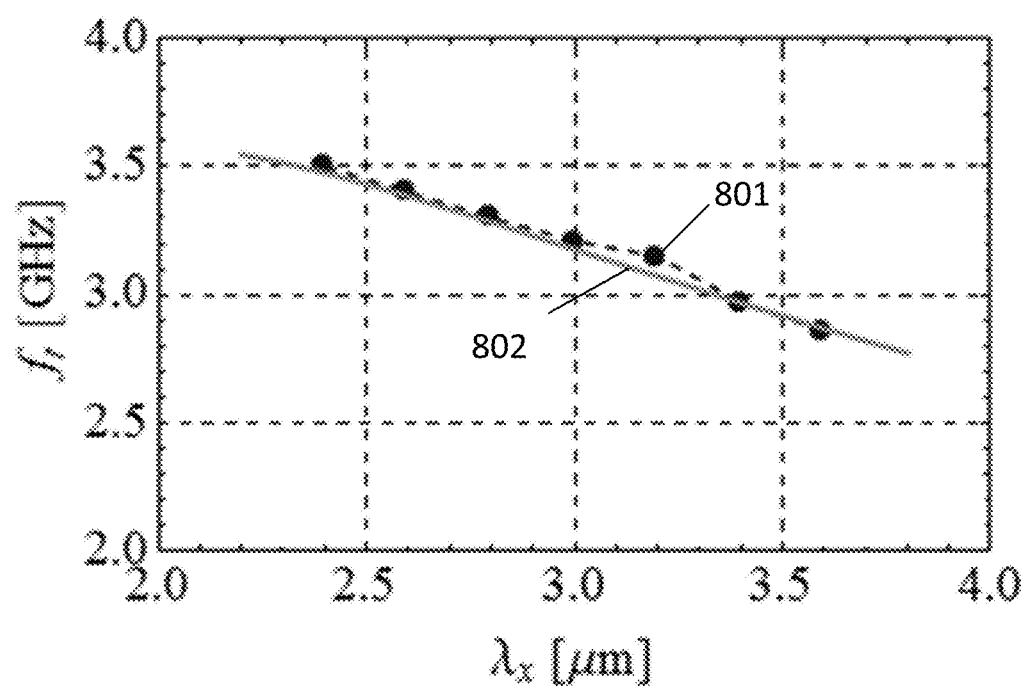
FIG. 8 compares resonance frequencies $f_r$ simulated through FEA with resonance frequencies obtained analytically for LFE dCLMRs, as the acoustic wavelength varies, according to one embodiment.

Referring to FIG. 8, resonance frequencies $f_r$ simulated through FEA is compared with resonance frequencies obtained analytically for LFE dCLMRs, as the acoustic wavelength $\lambda_x$ varies. Curve 801 represents the simulated $f_r$, and curve 802 represents the analytical $f_r$ with the presence of interdigitated electrode(s) neglected in both approaches. The thickness of the AlN plate ($T_{AlN}$) is 1.5 μm, which is the same value as used in the LFE experiment in FIG. 2. $\lambda_x$ varies between about 2.4 μm and about 3.6 μm. It can be seen from FIG. 8 that the analytical $f_r$ closely matches the simulated $f_r$.

FIG. 8 also shows that degenerate LFE CLMRs achieve a lithographic frequency shift of ~670 MHz around 3.2 GHz by varying $\lambda_x$ from about 2.4 μm to about 3.6 μm. Such variation does not lead to substantial decrease of $k_t^2$.

Frequency Tuning Through Metal Coverage Variation

The resonance frequency of the CLMRs may be tuned by changing the coverage (i.e., $\alpha = W_e/p$) of the interdigitated electrode(s). As used herein, the coverage of the interdigital electrode(s) refers to a ratio of the width of each conductive strip ($W_e$) to the pitch of adjacent conductive strips (p). As both $\widetilde{\mu_x}$ and $\widetilde{\mu_z}$ change along the x-direction, the equivalent mass density ($\rho^{(eq)}$) of CLMRs is a function of the coverage $\alpha$. As $\alpha$ varies, the effective sound velocity of the CLMRs would change and, consequently, the operating frequency of the device would change. In other words, the effective sound velocity and resonance frequency of the resonators can be lithographically changed by varying $W_e$ for a given p.

Figure 9:
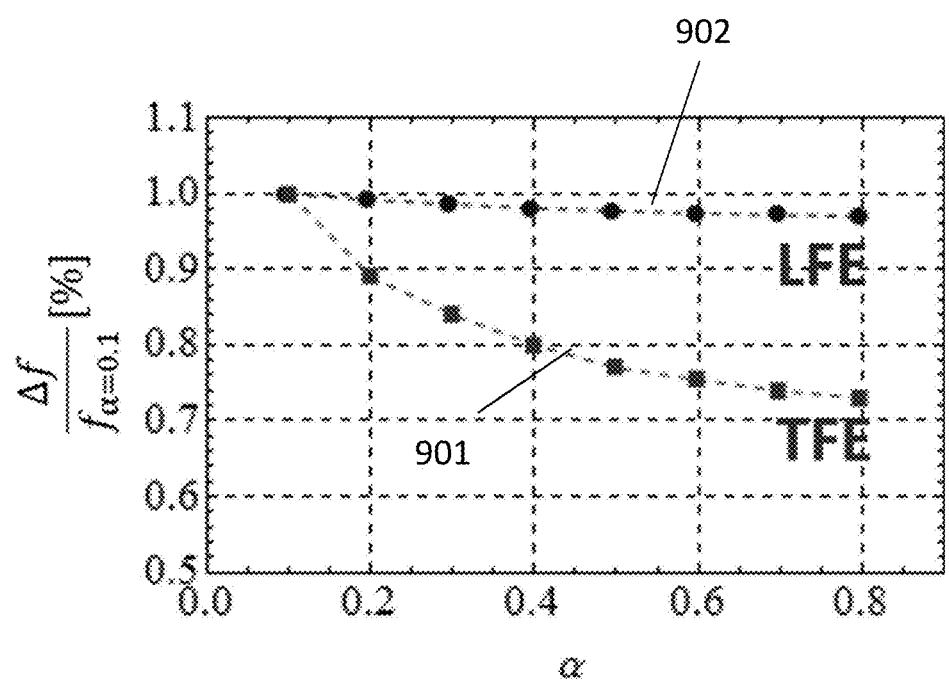
FIG. 9 depicts the resonance frequency $f_r$ simulated through FEA as the coverage of the interdigitated electrode(s) α varies, for TFE CLMRs and LFE CLMRs, according to one embodiment.

Referring to FIG. 9, resonance frequency $f_r$ simulated through FEA is shown for two-finger (i.e., n=2) TFE CLMRs and LFE CLMRs, as the coverage of the interdigitated electrode(s) $\alpha$ varies. Curve 901 is for the TFE CLMRs, and curve 902 is for the LFE CLMRS. CLMRs having two fingers may not achieve a device input impedance of 50Ω. However, the input impedance of 50Ω may be achieved through the adoption of resonator arrays. In computing $f_r$, it is assumed that the top and bottom IDTs of the TFE CLMRs are made of platinum and each have a thickness of $0.07 \cdot T_{AlN}$. The top IDTs of the LFE CLMRs are made of aluminum and have a thickness of $0.07 \cdot T_{AlN}$. The simulation results show that a lithographic frequency variation of ~30% can be attained on the TFE CLMRs, while the resonance frequency of the LFE is less sensitive to $\alpha$. Larger frequency tuning can be attained by using thicker platinum IDTs on the TFE CLMRs.

Figure 10:
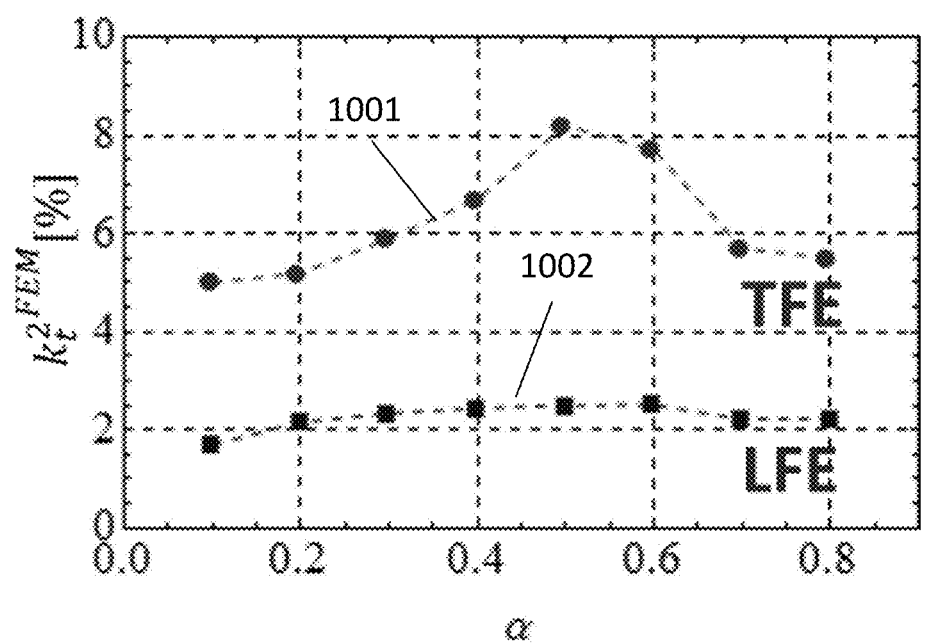
FIG. 10 depicts the he distribution of the $k_t^{2^{FEM}}$ is shown as the coverage of the interdigitated electrode(s) α varies for TFE CLMRs and LFE CLMR, according to one embodiment.
Figure 11:
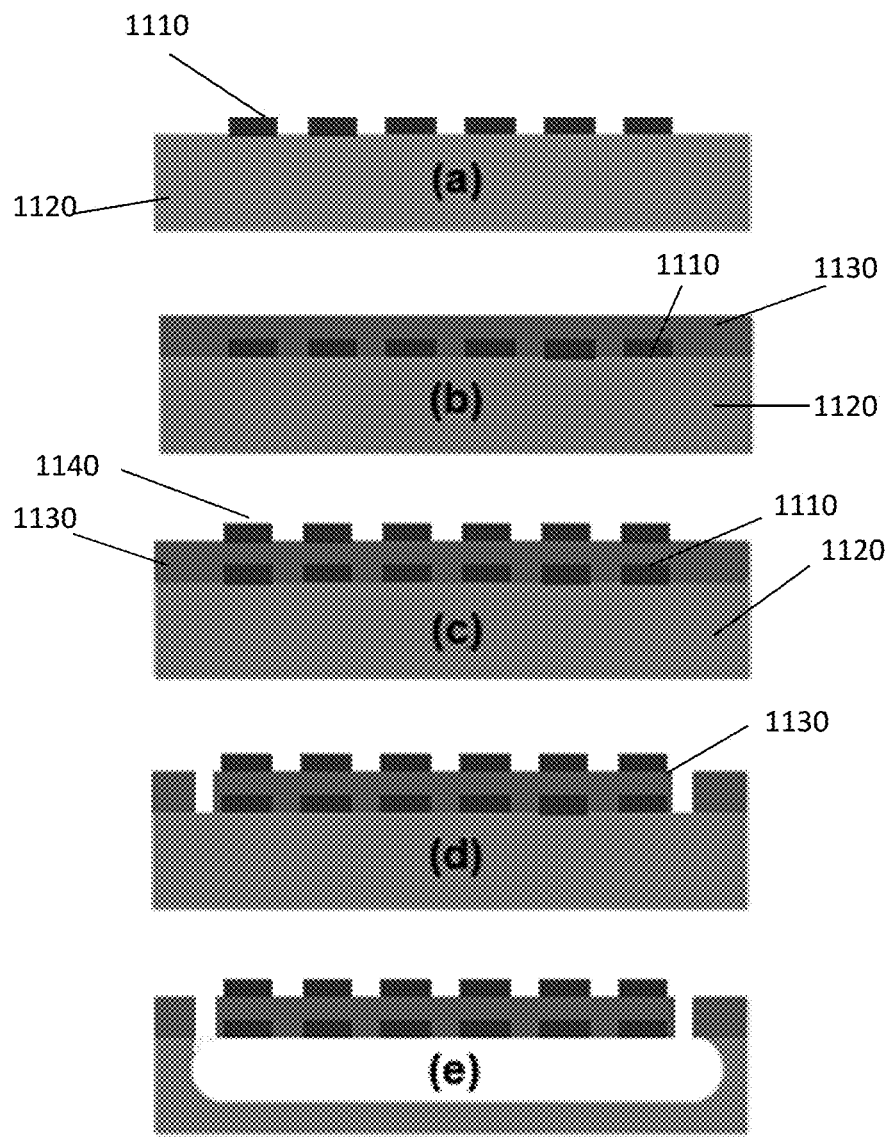
FIG. 11 depicts the steps of fabricating a TFE CLMR by using a four-mask microfabrication process, according to one embodiment.

Referring to FIG. 10, the distribution of the $k_t^{2FEM}$ is shown as the coverage of the interdigitated electrode(s) $\alpha$ varies for TFE CLMRs and LFE CLMRs of FIG. 9. Curve 1001 is for the TFE CLMRs, and curve 1002 is for the LFE CLMRs. As discussed above, a lithographic frequency variation of ~30% can be attained on TFE CLMRs using platinum IDTs (as in the experimental demonstration), and larger frequency tuning can be achieved if thicker platinum IDTs are used. At the same time, a $k_t^{2FEM}$ larger than 5% can be achieved on the TFE CLMRs for such high frequency tuning. In contrast, for the LFE CLMRs using aluminum IDTs, both the resonance frequency and $k_t^{2FEM}$ are less sensitive to $\alpha$ (as in our experimental demonstration). This may be due to the larger impact that platinum electrodes have on the effective sound velocity ($v_{eq}$) of the device comparing to aluminum electrodes.

Fabrication of CLMRs/dCLMRs and Experimental Results

The CLMR/dCLMRs described herein may be fabricated by appropriate microfabrication process. According to another embodiment, the resonators may be fabricated by a four-mask microfabrication process. The four-mask fabrication process may include: disposing a first electrode layer over a substrate, patterning the first electrode layer to form a bottom interdigitated electrode, disposing a piezoelectric layer over the substrate, disposing a second electrode layer over the piezoelectric layer, patterning the second electrode layer to form a top interdigitated electrode, etching the piezoelectric layer to form a piezoelectric micro-plate, and releasing the micro-plate from the substrate. The substrate may comprise, or be, any suitable material, such as silicon. According to one embodiment, the disposing of the electrode layers may include any suitable process, such as a sputter deposition process. According to one embodiment, the patterning of the electrode layers to form interdigitated electrodes may include any suitable process, such as a lift-off process. According to one embodiment, the disposing of the piezoelectric layer may include any suitable process, such as a sputter deposition process. The piezoelectric layer may include any suitable material, such as the aforedescribed piezoelectric materials. According to one embodiment, the etching of the piezoelectric layer to form a piezoelectric micro-plate may include any suitable process, such as an ion conductive plasma (ICP) process. The forming of the microplate may include forming a perimeter of the nano-plate. According to one embodiment, the releasing the piezoelectric layer from the substrate may include any suitable process, such as an isotropic etching process.

According to one embodiment, the resonators may be fabricated by a two-mask microfabrication process. The two-mask fabrication process may include: disposing a piezoelectric layer over a substrate, disposing an electrode layer over the piezoelectric layer, patterning the electrode layer to form an interdigitated electrode, etching the piezoelectric layer to form a piezoelectric micro-plate, and releasing the micro-plate from the substrate. The substrate may comprise, or be, any suitable material, such as silicon. According to one embodiment, the disposing of the piezoelectric layer may include any suitable process, such as a sputter deposition process. The piezoelectric layer may include any suitable material, such as the aforedescribed piezoelectric materials. According to one embodiment, the disposing of the electrode layer may include any suitable process, such as a sputter deposition process. According to one embodiment, the patterning of the electrode layer to form an interdigitated electrode may include any suitable process, such as a lift-off process. According to one embodiment, the etching of the piezoelectric layer to form a piezoelectric micro-plate may include any suitable process, such as an ion conductive plasma (ICP) process. The forming of the micro-plate may include forming a perimeter of the nano-plate. According to one embodiment, the releasing the piezoelectric layer from the substrate may include any suitable process, such as an isotropic etching process.

TFE CLMRs were fabricated and their performance was experimentally characterized. A device was formed by a 4 μm thick AlN layer and two 0.1 μm thick platinum IDTs, one IDT disposed on the top surface of the AlN layer and the other IDT disposed on the bottom surface of the AlN layer. Platinum was chosen as the bottom IDT material due to the need of growing a high quality AlN film, and as the top IDT material in order to preserve high acoustic symmetry in the cross-section of the device. The coverage of the platinum IDTs (α) was 0.5. The pitch of the IDTs setting (i.e., $\lambda_x/2$) was chosen so as to match the AlN thickness.

Figure 12:
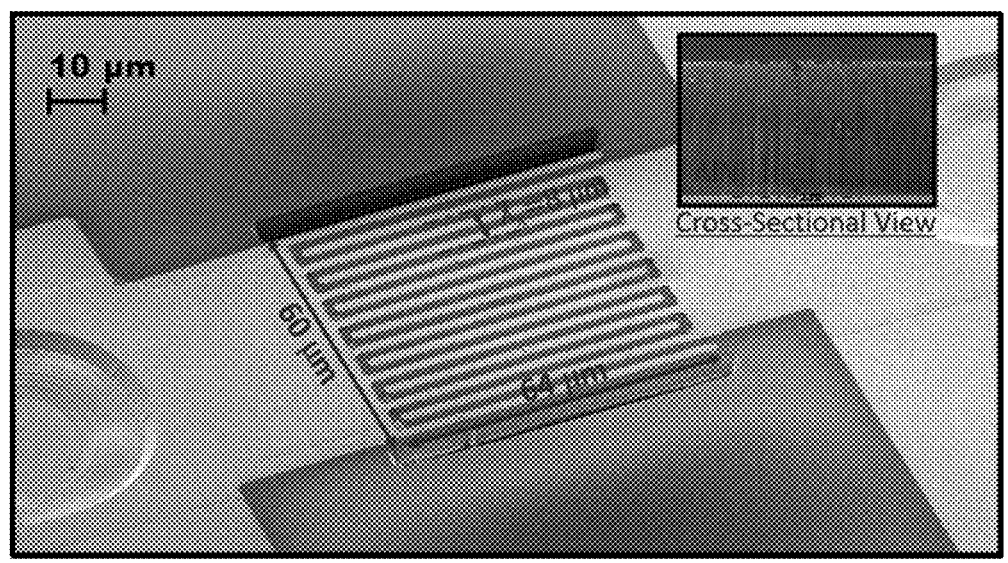
FIG. 12 depicts an SEM image of a fabricated AlN TFE CLMR, according to one embodiment.

Referring to FIGS. 11(a)-(e), steps of fabricating TFE CLMRs are shown according to one embodiment. The LFE CLMRs were fabricated using a four-mask microfabrication process. At step (a), a 100 nm thick Pt film was deposited on top of a high resistivity Silicon wafer 1120 through a 10 nm thick Ti layer used as adhesion layer, and was patterned through a lift-off process to form the bottom IDT 1110. At step (b), a 4 μm thick AlN film 1130 was sputter-deposited on the wafer. The AlN film 1130 may be wet etched to form vias. At step (c), a 100 nm thick Pt film was deposited on the AlN film 1130 through a 10 nm thick Ti layer, and was patterned through a lift-off process to form the top IDT 1140. At step (d), the AlN film 1130 was etched by ICP in $Cl_2$ based chemistry to define the width of the AlN plate. This was done through the use of a hard mask made out of 2 μm of $SiO_2$ so as to attain steep AlN sidewall angles (>75°). At step (e), the Silicon substrate underneath the resonator was released through $XeF_2$ isotropic etching. The SEM image of the fabricated device is shown in FIG. 12.

Figure 13:
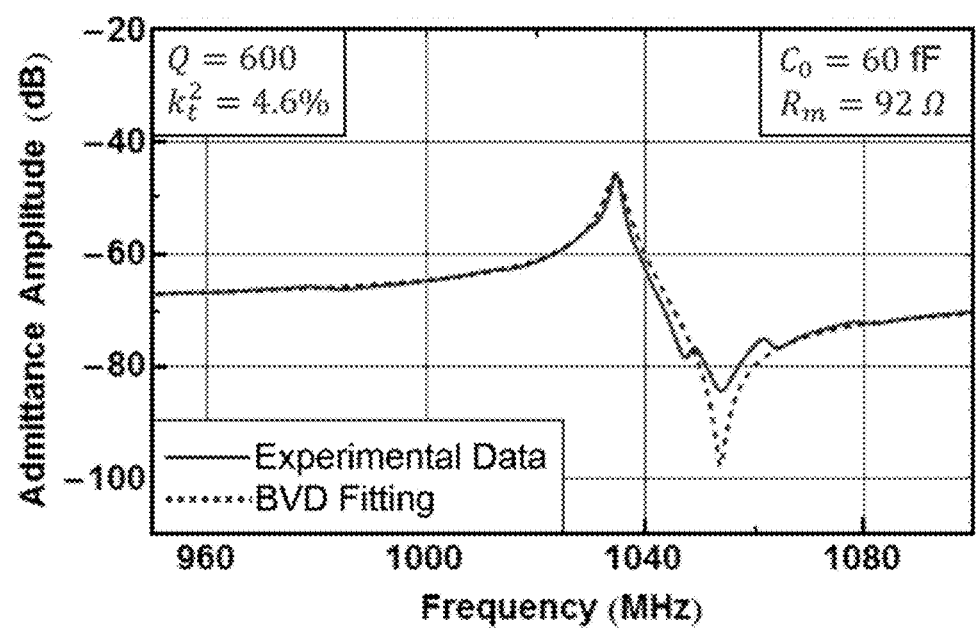
FIG. 13 depicts the distribution of admittance amplitude as a function of frequency for the AlN TFE CLMR of FIG. 12.

The electrical performance of the fabricated TFE CLMRs were measured, in air, by connecting the device, through Ground-Signal-Probes (GSG), to a commercial Network Analyzer (Agilent E5071C). Referring to FIG. 13, the measured admittance of the device and its fitting to the Butterworth-van Dyke (BVD) model are shown—they match well. The TFE CLMR used for the measurement has a $T_{AlN}$ of 4 μm and a $\lambda_x$ of 8 μm. The measured admittance was de-embedded from the directly extracted parasitic capacitance due to the probing pads (11 fF). The TFE CLMR shows a main resonant peak at about 1.02 GHz, a quality factor, Q, about 600, and a $k_t^2$ larger than 4.6%. This $k_t^2$ value is higher than the $k_t^2$ of other piezoelectric resonators using IDTs to actuate and sense mechanical vibrations in AlN plates. The experimental demonstration of such a high $k_t^2$ confirms the advantages of the disclosed CLMR technology, which is enabled by the combined use of the AlN $e_{31}$ and $e_{33}$ piezoelectric coefficients.

The fabricated device showed a relatively lower quality factor than the quality factor of other AlN resonators operating in the same frequency range. It may mostly be caused by a large amount of energy lost through anchor dissipations. It is believed that a refinement of the anchor design would help maximize the quality factor attained by TFE CLMRs. It is worth noting that the selected pitch size (4 μm) did not yield the highest possible $k_t^2$ value (~5.7% for the given material stack and mode order number). This might be due to the presence of the metallic IDTs which causes a slight variation of the optimum $T_{AlN}/\lambda_x$ value for the optimum transduction of the CLM and, consequently, the achievement of the highest electromechanical coupling coefficient. This was confirmed in FIG. 14.

Figure 14:
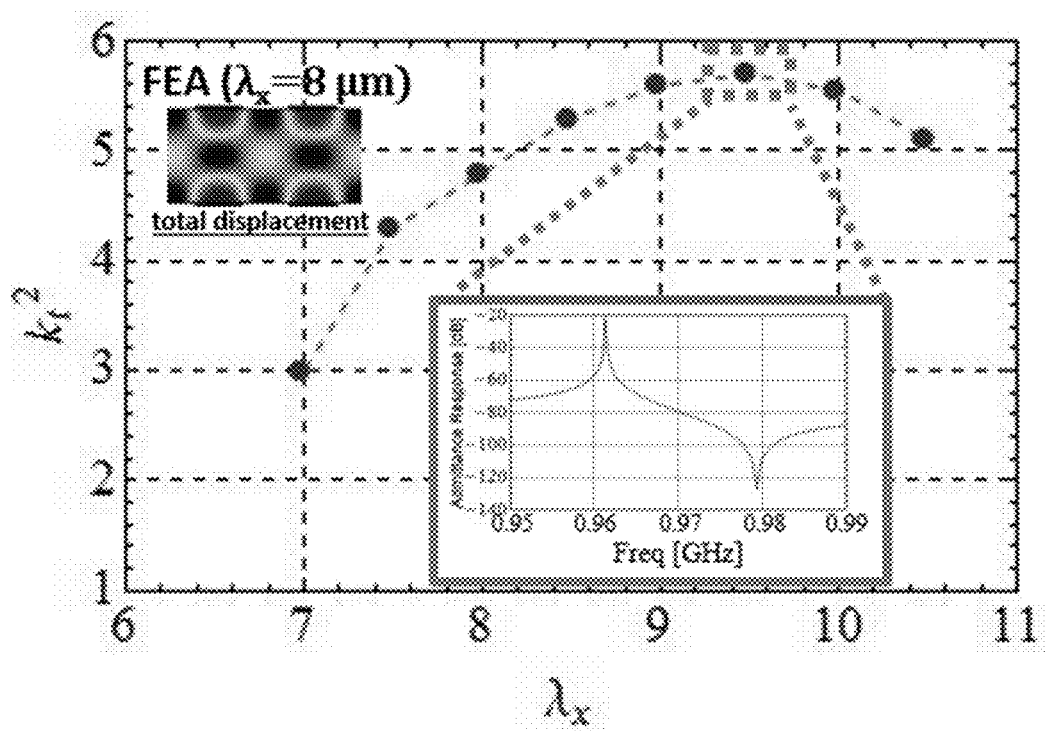
FIG. 14 depicts the simulated $k_t^2$, the simulated admittance Y, and the simulated mode-shape of total displacement for a TFE CLMR, according to one example.

FIG. 14 shows the simulated $k_t^2$ as a function of the acoustic wavelength $\lambda_x$ for the TFE CLMRs. In the simulation, AlN TFE CLMR with a thickness of 4 μm is used. The IDTs are 0.1 μm thick platinum and the coverage α is set to 0.5. From FIG. 14, the highest $k_t^{2^{FEM}}$ ($k_t^{2^{max}}$~5.7%) was attained at a pitch size of 5 μm (i.e. $\lambda_x$=10 μm). It is also worth noting that a $k_t^{2^{FEM}}$ higher than 4% can be achieved for a relatively large range of $\lambda_x$ values, thus not only when Equation (11) is strictly satisfied. As discussed above, this fact is enabled by the capability of exciting degenerate Lamé modes in AlN plates. The $k_t^{2^{max}}$ is larger than what is predicted when the presence of the metallic IDT is neglected. This may be due to the fact that the IDTs lower both the effective stiffnesses in the lateral ($C_{lat}$) and thickness ($C_{thic}$) directions, thus effectively increasing $K_{Chr[x]}^2$ and $K_{Chr[z]}^2$. FIG. 14 also shows the simulated admittance and the simulated mode-shape of the displacement relative to two adjacent fingers for $\lambda_x$=8 μm.

LFE CLMRs were fabricated and their performance was experimentally characterized. For example, a device was formed by a 1.5 μm thick AlN layer and a 0.2 μm thick aluminum IDT disposed on the top surface of the AlN layer. Different than the fabricated TFE CLMR discussed above, aluminum instead of platinum, which has a lower resistivity and a sound velocity closer to that of AlN, was chosen to be the IDT material. The coverage of the aluminum interdigitated electrode (α) was 0.5.

Figure 15:
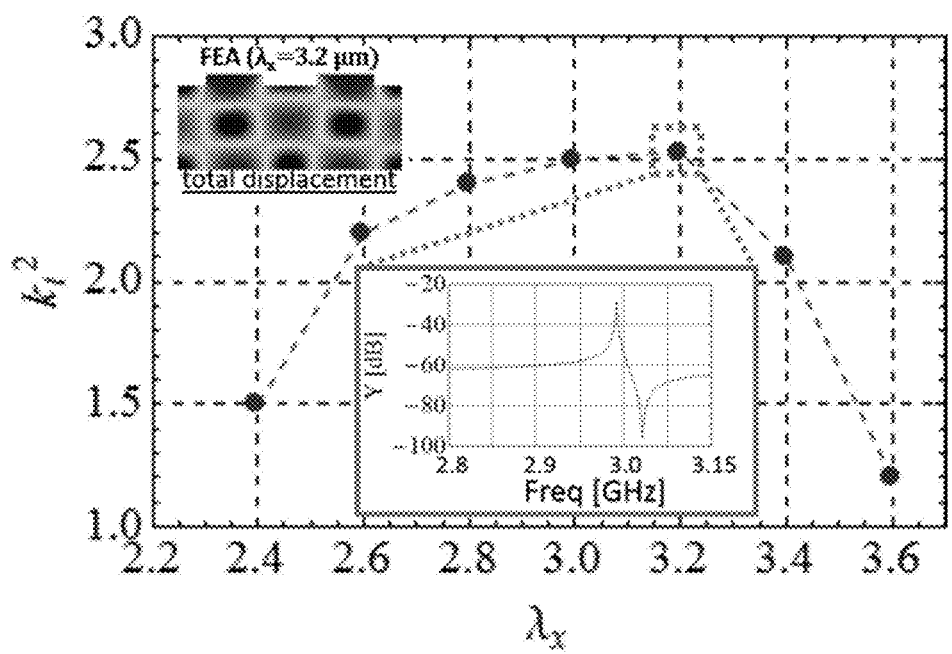
FIG. 15 depicts the simulated $k_t^2$, the simulated admittance Y, and the simulated mode-shape of total displacement for a LFE CLMR, according to one embodiment.
Figure 16:
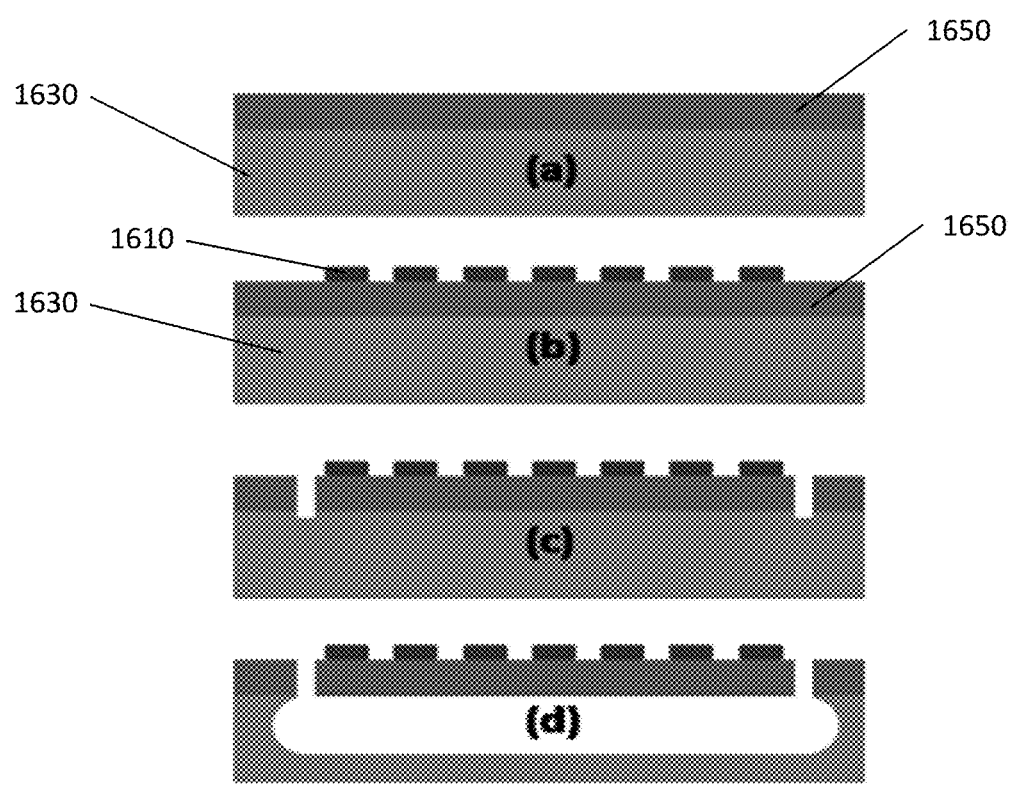
FIG. 16 depicts the steps of fabricating a LFE CLMR by using two-mask microfabrication process, according to one embodiment.

FIG. 15 shows the simulated $k_t^2$ as a function of the acoustic wavelength $\lambda_x$ for the LFE CLMRs. FIG. 15 also shows the simulated admittance and the simulated mode-shape of the displacement relative to two adjacent fingers for $\lambda_x=3.2$ µm. Similar to the TFE CLMRs discussed above, due to the presence of the metallic IDT used to excite the electric field in the AlN layer, the highest $k_t^2$ value is expected at a $T_{AlN}/\lambda_x$ value that is slightly different from what was found when the presence of the metal layers is neglected. Consequently, in order to maximize $k_t^2$, $\lambda_x$ is adjusted through FEA. FIG. 15 shows that maximum $k_t^2$ is attained at $\lambda_x$ close to 3.2 µm.

Figure 17:
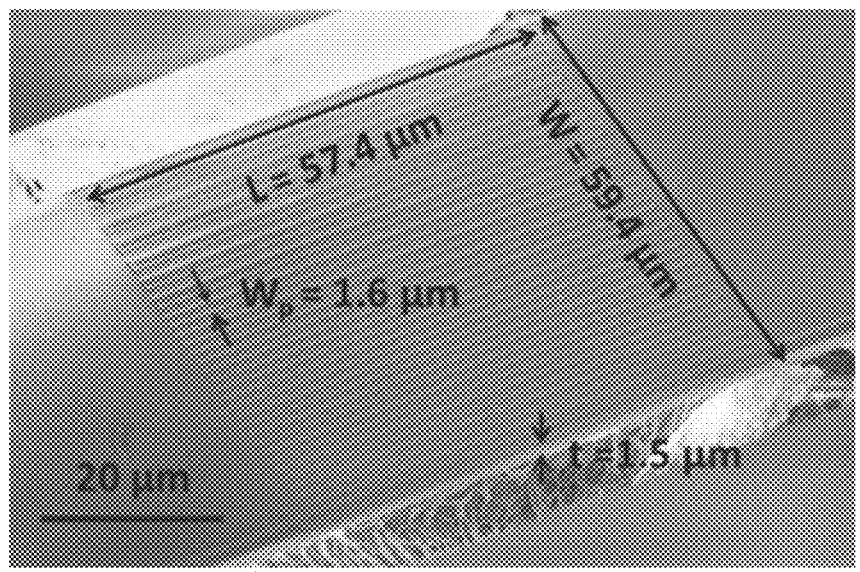
FIG. 17 depicts a scanning electron microscope (SEM) image of a fabricated AlN LFE CLMR, according to an embodiment.

Referring to FIGS. 16(a)-(d), steps of fabricating an AlN LFE CLMR are shown according to one embodiment. The LFE CLMRs were fabricated using a two-mask microfabrication process. At step (a), a 1.5 µm thick AlN film 1650 was sputter-deposited on top of a high resistivity silicon wafer substrate 1630. At step (b), a 200 nm thick Al film was deposited on top of the AlN film and patterned through etching to define the top interdigitated electrode 1610. At step (c), the AlN film was etched by ICP in $Cl_2$ based chemistry to define the width of the AlN plate. At step (d), the silicon substrate underneath the AlN resonator was released through $XeF_2$ isotropic etching. An SEM image of the fabricated device is shown in FIG. 17.

Figure 18:
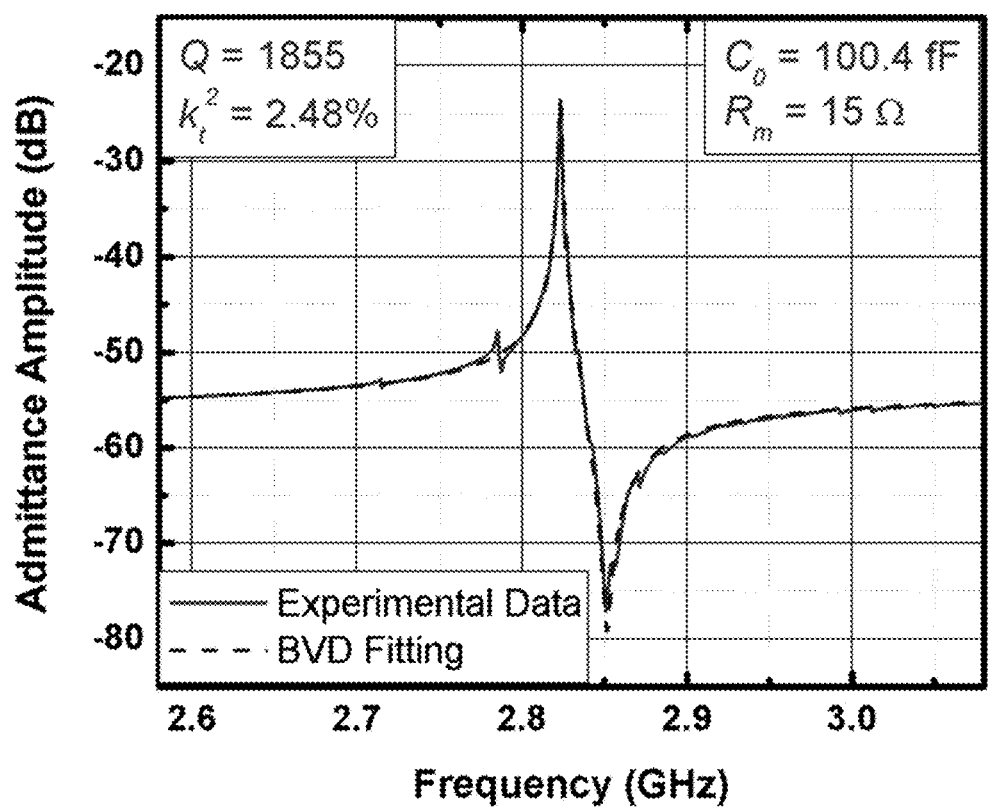
FIG. 18 depicts the distribution of admittance amplitude as a function of frequency for the AlN LFE CLMR of FIG. 17.

The electrical performance of the fabricated LFE CLMR was measured, in air, by connecting the device, through Ground-Signal-Ground probes (GSG), to a commercial Network Analyzer (Agilent E5071C). Referring to FIG. 18, the measured admittance of the device and its fitting to the Butterworth-van Dyke (BVD) model are shown—they match well. The LFE CLMR used for the measurement has a $T_{AlN}$ of 1.5 µm and a $\lambda_x$ of 3.2 µm. The LFE CLMR shows a main resonant peak at about 2.82 GHz, a quality factor, Q, about 1855, and a $k_t^2$ about 2.48% which closely matches the FEM predicted value in FIG. 15. This $k_t^2$ value is slightly larger than what is predicted when the presence of the metallic IDT is neglected. It may be due to the fact that the aluminum lowers both the effective stiffnesses in the lateral ($C_{lat}$) and thickness ($C_{thic}$) direction, thus leading to higher $K_{Chr[x]}^2$ and $K_{Chr[z]}^2$. The measured $k_t^2$ and Q results in a $k_t^2 \cdot Q$ product (i.e. Figure of Merit (FoM)) close to 46, which is higher than the FoM of any LFE MEM resonators disclosed before that employed a single top IDT fabricated through a 2-mask fabrication process.

Plasmonic Piezoelectric Resonator for Infrared/Terahertz Sensing

Infrared (IR) detectors may be employed in military and space applications, such as night vision, surveillance and targeting and civilian applications, such as health care, automotive, chemical and biological sensing, and telecommunications. With the recent advances in Micro/Nano-Electro-Mechanical Systems (MEMS/NEMS), uncooled IR thermal detectors based on MEMS/NEMS technology have attracted much attention due to their potentially ultra-high resolution and advantages in terms of size and cost, compared to pre-existing cryogenically cooled semiconductor photon detectors. MEMS resonant broadband IR detectors based on quartz, and gallium nitride piezoelectric resonators have been demonstrated and showed promising performance. However, for gallium nitride resonators, specific IR absorbing materials are generally needed to coat on the resonators, which would deteriorate the electromechanical performance of the resonators. Although the IR absorbing coating is not needed for quartz resonators, the top metal electrode covers large area of quartz, reducing significantly the IR absorption.

The plasmonic piezoelectric nano-plate resonant (PP-NPR) IR detectors disclosed herein uses an ultra-thin piezoelectric metamaterial as an IR absorber, and at the same time uses the ultra-thin piezoelectric metamaterial to form a resonant body for sensing and actuating a high frequency bulk acoustic mode of vibration in the piezoelectric metamaterial. Thus, a MEMS resonator with a unique combination of optical and electromechanical properties can be implemented. The resonance frequency of the device is highly sensitive to IR radiation at a spectrum range of interest. In particular, a high frequency (10 s MHz~10 s GHz) bulk acoustic mode of vibration may be actuated and sensed in the free-standing ultra-thin piezoelectric metamaterial.

Instead of adding an IR absorbing layer to the material stack forming the resonator, the plasmonic piezoelectric resonant IR detectors disclosed herein employs a transformative approach to enhance the IR absorbing capability, in which, the IR absorption properties of the piezoelectric nano-plate resonator itself are properly tailored to achieve strong spectrally selective absorption of long-wavelength infrared (LWIR) radiation over a subwavelength thickness. With the design disclosed herein, the electromechanical loading effect associated with the integration of an IR absorber can be eliminated and high electromechanical performance can be achieved. For example, a quality factor, Q of about 2000, and an electromechanical coupling coefficient, $k_t^2$ of about 2%, can be achieved on the PP-NPR IR detectors.

In addition, a strong and spectrally selective absorption of LWIR radiation (e.g., higher than 80% as peak values at lithographically determined center frequency) can be achieved, by properly patterning the top metal layer of the PP-NPR. The physical origin of the high absorption in the LWIR range relies on the excitation of surface plasmon polarizations within the subwavelength nanostructures. The spectral range of absorption can be tuned by adjusting the dimensions of the nanostructures in the process of electron beam lithography.

In other words, high thermomechanical coupling between electromagnetic and mechanical resonances can be achieved in a single ultra-thin piezoelectric nano-plate. The device can simultaneously act as an efficient piezoelectric transducer (without the need of off-chip actuation and sensing techniques), a high frequency and high Q bulk-extensional mode mechanical resonator, and a sub-wavelength, strong, and spectrally selective IR absorber (without the need of integrating additional IR absorbing materials). Thus, the device has the advantages of high sensitivity, power efficient on-chip transduction, and strong, spectrally selective absorption coefficient over an ultrathin thickness.

In some embodiments, the plasmonic piezoelectric nano-plate resonant IR detector may be based on the AlN MEMS technology. Ultra-thin (10 s nm~100 s nm) and high quality AlN film can be directly deposited on silicon substrates by low-temperature sputtering process, thereby enabling the fabrication of ultra-low volume resonators with excellent electromechanical performance. Furthermore, due to the post-CMOS compatibility of the microfabrication process used for the fabrication of AlN MEMS resonant devices, the AlN MEMS resonant sensors and CMOS electronic readouts can be integrated on a same substrate, which is an attractive feature for implementing ultra-miniaturized, high performance and low power sensing platform.

In some embodiments, two nano-scale metallic tethers are used to support the plasmonic piezoelectric resonant body. Comparing to conventional anchors which are typically defined by the relatively thick and thermally conductive piezoelectric materials, this design significantly improves thermal isolation of the detector from the substrate (heat sink) by maximizing the thermal resistance. Thus, the overall responsivity of the device may be significantly improved (e.g., from about $10^4$ K/W to about $10^5$ K/W), resulting in an improved resolution (low noise equivalent power). On the other hand, the thermal time constant of the device can remain less than about 1 ms, due to the unique scaling capability of the AlN piezoelectric technology (i.e., by using ultra-thin and high quality AlN piezoelectric film to form the resonant body). Thus, a fast (thermal time constant of about 100 s μs) and high resolution (noise equivalent power of about 1 nW/Hz$^{1/2}$) LWIR detector with a near unity absorption for a lithographically defined spectrum range of interest can be achieved.

The PP-NPR IR detector disclosed herein may find application in the field of IR/THz imaging and spectroscopy, such as, chemical biological threats detection, night vision, infrared homing, multi-color infrared seeking, remote sensing, distributed environmental monitoring and healthcare application, pathogens and drugs detection and identification, etc.

Figure 19B:
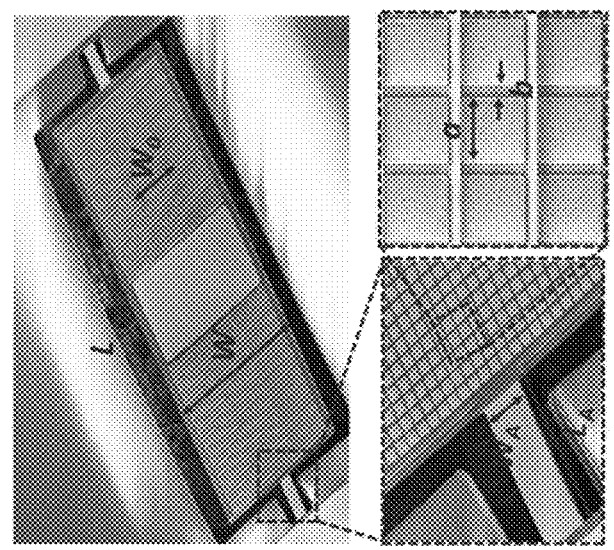
FIG. 19(b) depicts an SEM image of a fabricated PP-NPR, according to one embodiment.
Figure 19A:
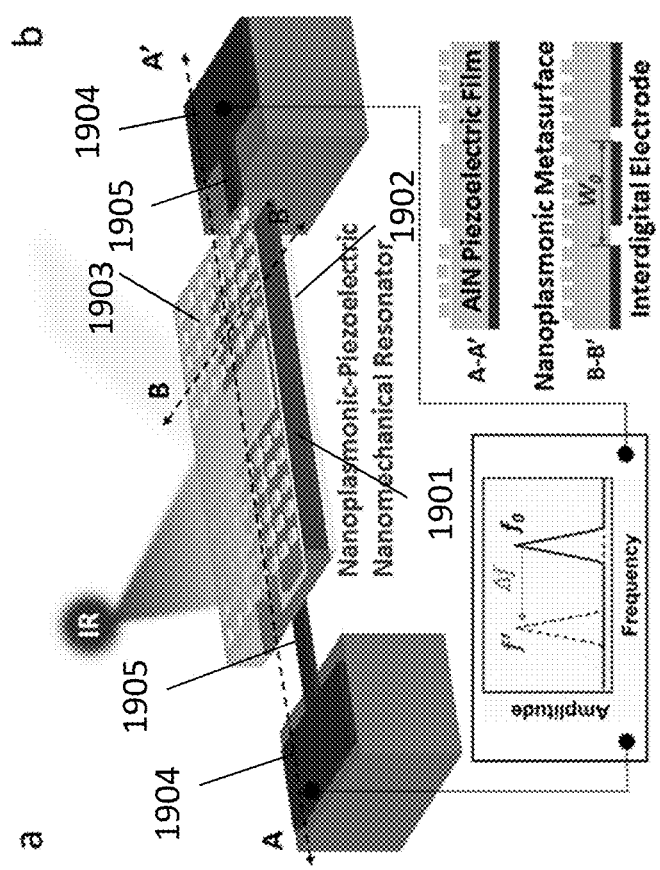
FIG. 19(a) depicts a schematic representation of a plasmonic piezoelectric nano-plate resonator (PP-NPR) as an infrared (IR) detector, according to one embodiment.

Referring to FIG. 19(a), a schematic representation of a PP-NPR IR detector is shown according to one embodiment. The PP-NPR IR detector includes an AlN piezoelectric plate 1901, a bottom interdigitated transducer (IDT) 1902 disposed on a bottom surface of the AlN plate 1901, and a nanoplasmonic metasurface 1903 disposed on a top surface of the AlN plate 1901. In some embodiments, the thickness of the AlN plate 1901 is in a range of 10 nm to 1 μm. In some embodiments, the bottom IDT is made of a metal layer, such as a platinum (Pt) layer, and includes multiple strips of metal. In some embodiments, the nanoplasmonic metasurface 1903 is made of a metal such as gold (Au). The nanoplasmonic metasurface 1903 may be patterned so as to confine an electric field induced by the bottom IDT across the AlN plate 1901, and at the same time, facilitates absorption of IR radiation by the ultra-thin piezoelectric nano-plate 1901. In some embodiments, the pattern of the nanoplasmonic metasurface 1903 has a plurality of unit cells. The patterned nanoplasmonic metasurface 1903 may significantly enhances field concentration, thereby facilitating spectrally selective absorption of IR radiation over the ultra-thin structure.

In operation, an alternating voltage is applied to the bottom IDT 1902. The nanoplasmonic metasurface 1903 is electrically floating and acts to confine the electric field across the AlN plate 1901. A high order contour-extensional mode of vibration may be excited through the equivalent piezoelectric coefficient of AlN ($e_{31}$). The resonance frequency of the PP-NPR is defined by the pitch of the bottom IDT ($W_0$) of the IDT and the equivalent Young's modulus, $E_{eq}$, and density, $\rho_{eq}$. Specifically, $$f = \frac{1}{2W_0}\sqrt{\frac{E_{eq}}{\rho_{eq}}}. \quad (25)$$

The incident IR radiation absorbed by the PP-NPR may cause a significant and instant increase of the device temperature, due to the excellent thermal isolation and low thermal mass of the freestanding AlN plate. As used herein, "freestanding" means that the AlN plate isreleased from the substrate. The IR induced temperature rise results in a shift of the resonance frequency from $f_0$ to $f'$ of the mechanical vibration of the resonator according to an intrinsic temperature coefficient of frequency (TCF about −30 ppm/K) of the device. Thus, the incident optical power can be detected by monitoring the resonance frequency of the device.

The PP-NPR IR detector may further include two nanoscale metallic tethers 1905 supporting the resonant body and connecting the bottom IDT 1902 to metallic pads 1904. The alternating voltage may be supplied through the metallic pads 1904 to the bottom IDT 1902. The tether design may significantly improve thermal isolation of the detector from the substrate (heat sink) by maximizing the thermal resistance. Thus, the overall responsivity of the device may be significantly improved (e.g., from about $10^4$ K/W to about $10^5$ K/W), resulting in an improved resolution (low noise equivalent power). On the other hand, the thermal time constant of the device can remain less than about 1 ms, due to the unique scaling capability of the AlN piezoelectric technology (i.e., by using ultra-thin and high quality AlN piezoelectric film to form the resonant body). Thus, a fast (thermal time constant of about 100 s μs) and high resolution (noise equivalent power of about 1 nW/Hz$^{1/2}$) LWIR detector with a near unity absorption for a lithographically defined spectrum range of interest can be achieved.

Referring to FIG. 19(b), an SEM image of a PP-NPR is shown, according to one embodiment. $W_0$ is the pitch of the bottom IDT 1902, L is the length of the resonator body, and W is width of the resonator body. $W_A$ is the width of the tether 1904, and $L_A$ is the length of the tether. a+b is the pitch of the unit cell of the plasmonic metasurface. In one embodiment, the pitch, $W_0$, of the IDT was set to 25 μm, targeting a resonance frequency of about 160 MHz. The critical dimensions of the unit cell forming the plasmonic metasurface were optimized by three-dimensional (3D) Finite Integration Technique (FIT) simulations using CST, and set to a=1635 nm and b=310 nm for a maximum spectrally selective IR absorptance centered at a spectral wavelength λ of about 9 μm.

Figure 20:
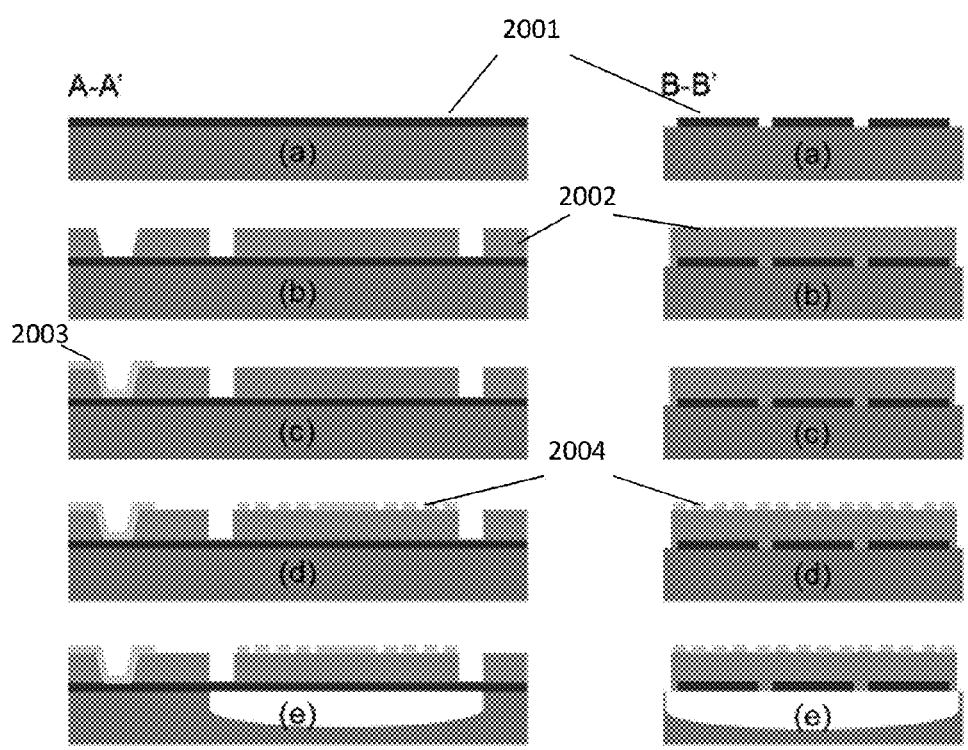
FIG. 20 depicts the steps of fabricating the PP-NPR of FIG. 19(b), according to one embodiment.

Referring to FIG. 20, steps of fabricating of the PP-NPR IR detector of FIG. 19(b) are shown, according to one embodiment. The detector was fabricated using a combination of 4-mask photo-lithography and 1-e-beam lithography micro/nano-fabrication process. At step (a), a 100 nm thick platinum was sputter-deposited on a high resistivity silicon (Si) wafer and patterned by lift-off process to define the bottom IDT 2001. At step (b), a 500 nm thick high quality c-axis oriented AlN film 2002 was sputter-deposited and wet-etched by phosphoric acid ($H_3PO_4$) to open vias as access to the bottom electrodes. The shape of the AlN nano-plate was defined by dry-etching the AlN film in $Cl_2$ based chemistry. At step (c), a 100 nm thick gold was deposited by e-beam evaporation and patterned by lift-off process to define the top probing pad 2003. At step (d), a 50 nm thick gold was deposited by e-beam evaporation and patterned by e-beam lithography and lift-off process to define the plasmonic nanostructures and the solid metal plate on the top surface 2004 of the AlN nano-plate. At step (e), the Si substrate underneath the device was completely etched using xenon difluoride ($XeF_2$) isotropic etching to release the structure. The fabricated PP-NPR IR detector is shown in the SEM image in FIG. 22(b).

Figure 21:
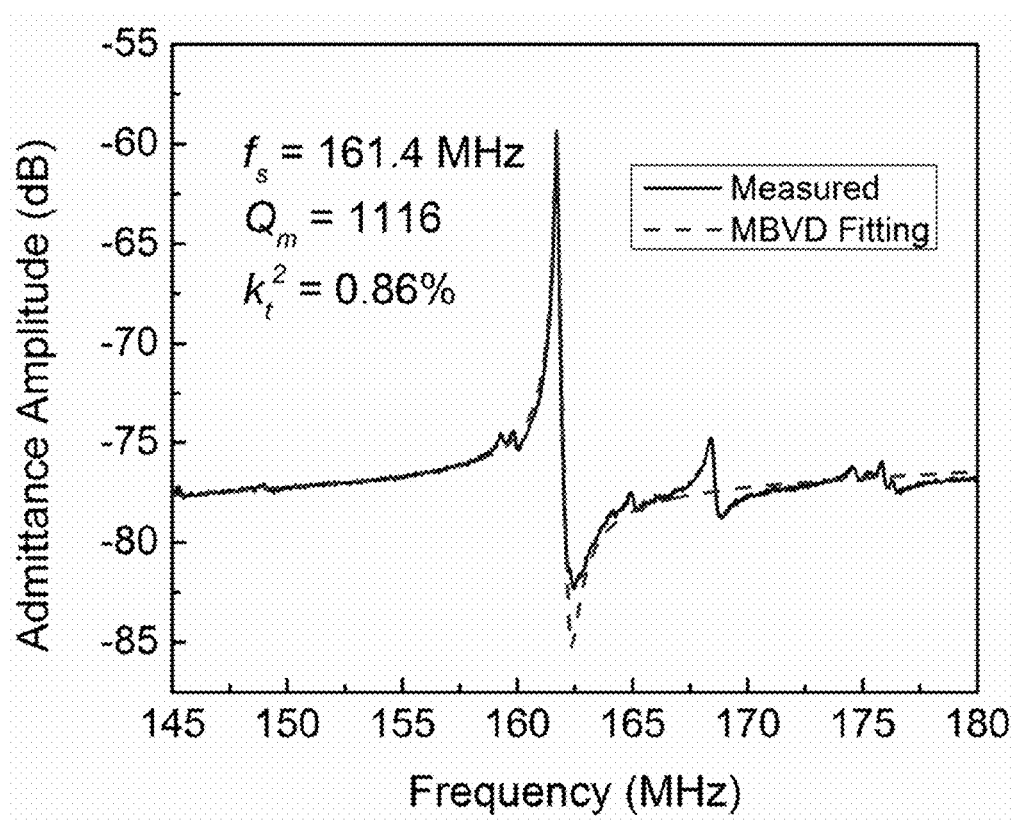
FIG. 21 compares the measured admittance amplitude with modified Butterworth-Van Dyke (MBVD) fitting for the PP-NPR fabricated in FIG. 20, as the frequency varies.

Referring to FIG. 21, the measured admittance amplitude and modified Butterworth-Van Dyke (MBVD) fitting of the PP-NPR are shown as the frequency varies. The admittance amplitude was measured by an Agilent E5071C network analyzer on the fabricated PP-NPR after an open-short-load calibration on a standard substrate. FIG. 21 shows a resonance frequency at about 161.4 MHz. A mechanical quality factor Q of 1116 and an electromechanical coupling coefficient $k_t^2$ of 0.86% were detected, which indicates that the use of an ultra-thin piezoelectric metamaterial to form the resonant body of the device does not deteriorate the electromechanical performance of the resonator. The TCF of the device was measured using a temperature controlled RF probe-station and found to be −23 ppm/K, which is comparable to the typical values of conventional 500 nm thick AlN contour-mode resonators.

Figure 22:
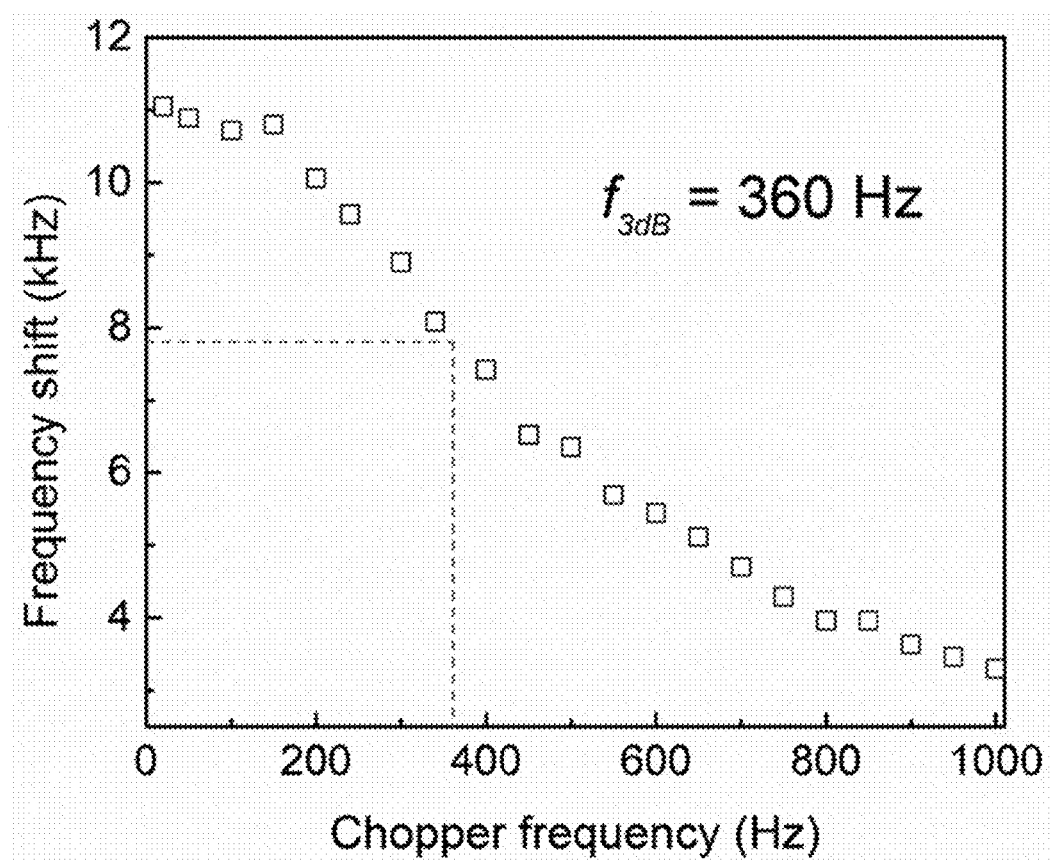
FIG. 22 depicts the measured frequency response as the Chopper frequency varies, according to one embodiment.

Referring to FIG. 22, the measured frequency response is shown as the resonance frequency varies. The frequency response of the PP-NPR was measured by using a 5 μm quantum cascaded laser and an optical chopper. FIG. 22 shows a 3 db cut off frequency at about 360 Hz.

In addition, the thermal properties of the detector were evaluated by a 3D finite element method (FEM) simulation using COMSOL multiphysics. The thermal resistance of the device was evaluated by applying different levels of thermal power to the device and monitoring the temperature rise. A $R_{th}$ of about $2.3 \times 10^5$ K/W was extracted from the FEM simulation, which is at least one order of magnitude higher than what has been recently reported for conventional piezoelectric resonant IR detectors. The responsivity of the detector was calculated by multiplying the measured TCF and the simulated $R_{th}$, which is about 0.5 Hz/nW. The thermal time constant of the IR detector was obtained by extracting the 3 db cut off frequency of the device by measuring the device frequency response (See FIG. 22). A thermal time constant τ of about 440 μs was extracted according to $\tau = 1/(2\pi f_{3db})$. Such fast device response is due to the extremely small volume of the nano-plate resonator with reduced thermal mass.

Figures 23A, 23B:
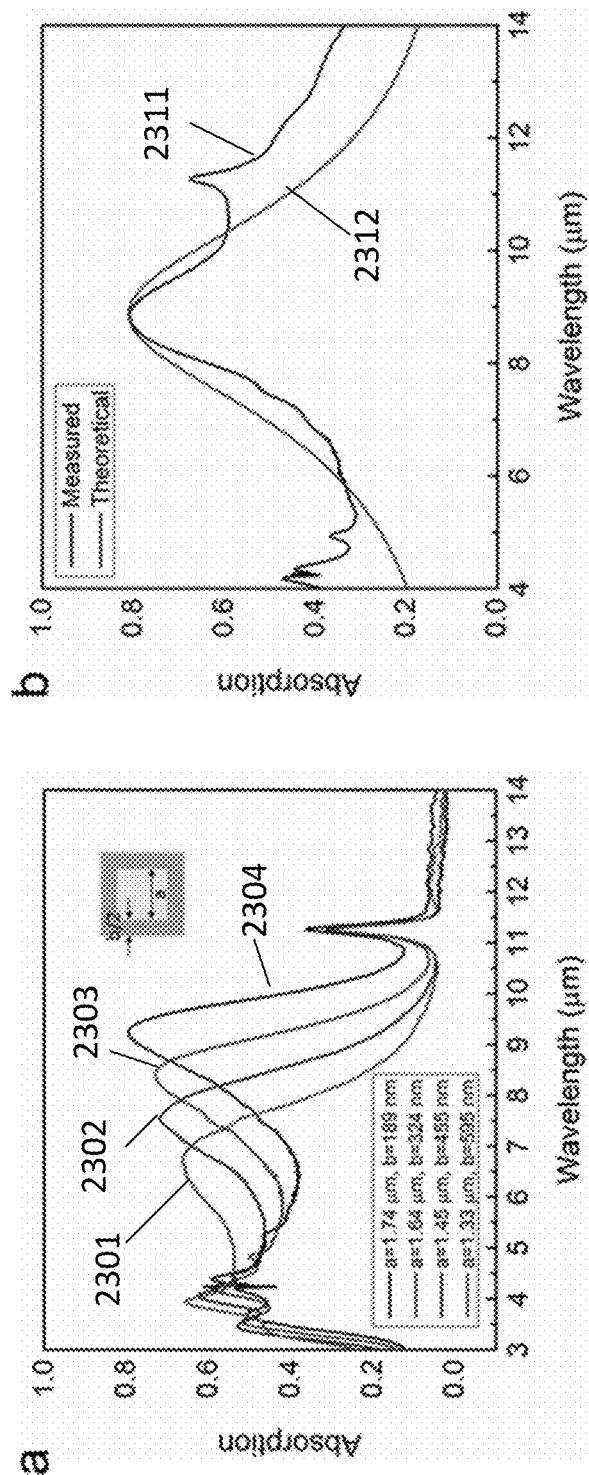
FIG. 23(a) depicts measured absorption FTIR spectra for four (4) fabricated plasmonic metasurfaces with various unit cell dimensions.
FIG. 23(b) compares simulated absorption of a fabricated PP-NPR with the measured absorption, according to one embodiment.

Referring to FIG. 23(a), measured absorption FTIR spectra are shown for 4 fabricated plasmonic metasurfaces with various unit cell dimensions. The reflection spectra R were measured using a Bruker V70 Fourier transform infrared (FTIR) spectrometer and Hyperion 1000 microscope. The spectral absorptance A was estimated as A=1-R, with an assumption of no transmission through the resonant structure. The assumption is reasonable given the large metal coverage of both the top Au plasmonic structures and bottom IDT. Curve 2301 is for the device in which a=1.33 μm and b=595 nm, curve 2302 for a=1.45 μm and b=455 nm, curve 2303 for a=1.64 μm and b=324 nm, and curve 2304 for a=1.74 μm and b=189 nm. FIG. 23(a) showed a strong and spectrally selective absorption of LWIR radiation.

Referring to FIG. 23(b), simulated absorption of the fabricated PP-NPR is compared with the measured absorption. Similarly, the reflection spectrum was measured for a fabricated PP-NPR IR detector with unit cell dimension of a=1635 nm and b=310 nm. Curve 2311 represents the measured absorption, and curve 2312 represents the simulated absorption. FIG. 23(b) shows a high LWIR absorption of about 80% due to the strong electromagnetic wave localization at the resonance of excited surface plasmon polarization at a wavelength of around 9 μm.

Figure 24:
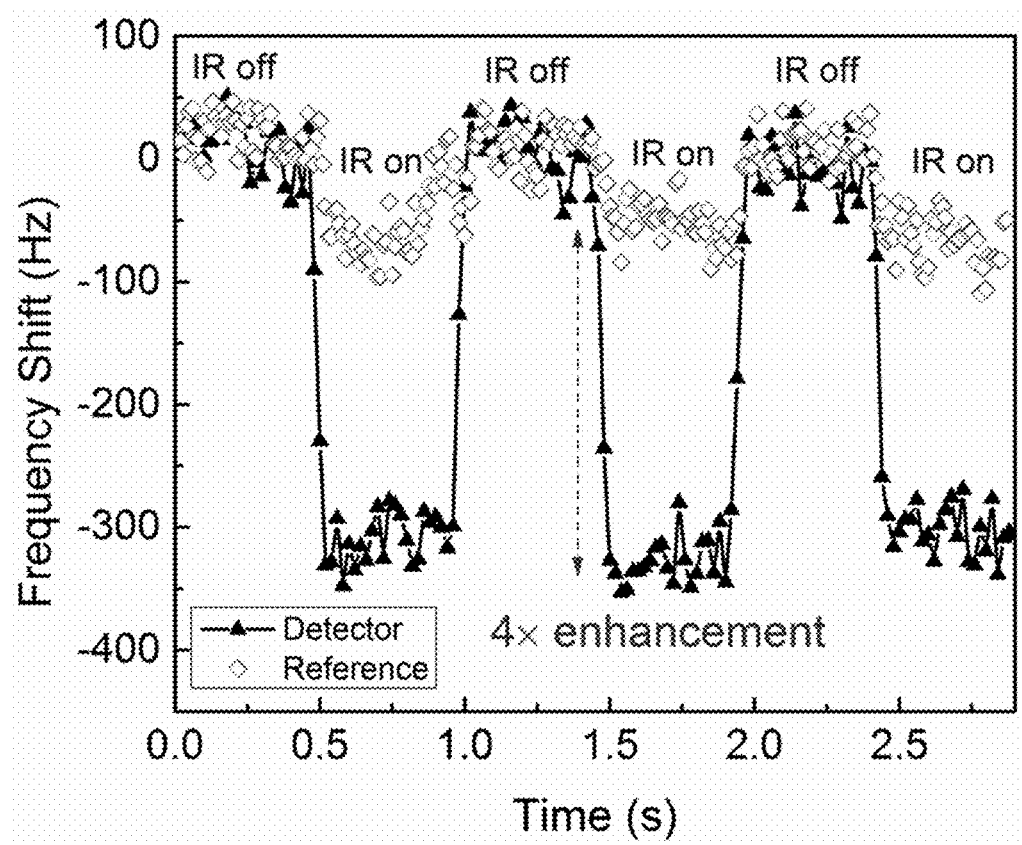
FIG. 24 compares measured response of a fabricated PP-NPR to a broadband IR radiation with a reference response of a conventional AlN MEMS resonator.

Referring to FIG. 24, measured response of the PP-NPR IR detector to a broadband IR radiation is compared to a reference response of a conventional AlN MEMS resonator. In measuring the response of the PP-NPR, a 1500 K globar with emissions at wavelengths of 2 μm-16 μm was used as an IR source and coupled to a Bruker Hyperion 1000 microscope for focusing the IR beam onto the device. The incident IR radiation was modulated by an optical chopper at 1 Hz. Incoming IR radiation resonator with similar characteristics in terms of $R_{th}$ and TCF was used for measuring the response of the conventional AlN MEMS. Due to the properly engineered absorption properties, the nanoplasmonic piezoelectric resonator shows an impressive enhanced responsivity to the radiation emitted by the globar, which was about four times of the responsivity of the conventional resonator, despite the relatively broadband emission of the globar compared to the 1.5 μm FWHM. Based on the measured noise spectral density of ~1.46 Hz/Hz$^{1/2}$, the NEP of the detector was calculated by dividing the noise spectral density by the responsivity, and found to be ~2.9 nW/Hz$^{1/2}$.

Gravimetric Sensors

In recent years, the Nano-ElectroMechanical systems (NEMS) have been used for a large number of applications spanning from semiconductor based technology to fundamental science. In particular, NEMS resonators have been exploited as transducers for the extremely sensitive gravimetric sensors. Sub-attogram mass resolution has been demonstrated in NEMS cantilevers due to the minuscule mass and the relatively high quality factor (Q).

The greatly reduced dimensions of the NEMS devices make them very sensitive to added mass, but render the transduction very hard to implement. In fact, the piezoelectric and electrostatic techniques employed by MEMS devices for sensing and actuation have not been directly applied to the NEMS domain due to increased parasitic effects associated with the scaled dimensions of the devices and the higher frequency of operation. For example, the extraordinary advantage that piezoelectric actuation can achieve high values of electromechanical coupling coefficient (order of magnitude larger than electrostatic transduction), has not been transferred to the nanodomain because of the unavailability of nanoscaled piezoelectric films.

In the embodiments disclosed herein, fundamental transduction problems in NEMS resonators can be solved using on chip piezoelectric actuation and sensing by aluminum nitride (AlN) nanostructures. Resonance frequencies as high as 10 GHz have been achieved by piezoelectric excitation of nano-strips AlN in the contourextensional mode of vibration (contrary to flexural vibrations generally employed in the NEMS devices demonstrated to date). At the same time, the increased parasitic effects associated with the reduced dimensions of the AlN nano-strips can be overcome by mechanically coupling a large number (up to 99) of these devices. Thus, all the nano-resonators comprised in the resulting array can be directly actuated and sensing piezoelectrically, and all resonators are mechanically forced to simultaneously vibrate at the same frequency.

In conventional resonant sensors, such as Quartz Crystal Microbalances (QCMs) or Thin Film Bulk Acoustic Wave Resonators (FBARs), the operating frequency is generally set by the thickness of the piezoelectric layer that is intrinsically related to the sensitivity of the device to mass loading. By contrast, the AlN CMR-S disclosed herein uses the film thickness to set the device sensitivity, independently from the frequency of operation. Thus, the frequency of operation of the CMR-S can be set according to the specifications of desired applications, while the value of mass sensitivity can be achieved independently by scaling the device thickness. Specifically, the sensitivity of a CMR-S to mass per unit area loaded on its top surface is:

$$S_{CMR-S} = -\frac{f_0}{2\rho_{eq}T}, \tag{26}$$

wherein $\rho_{eq}$ is the device equivalent mass density, $f_0$ is the resonance frequency, and T is the thickness of the plate.

Figure 25:
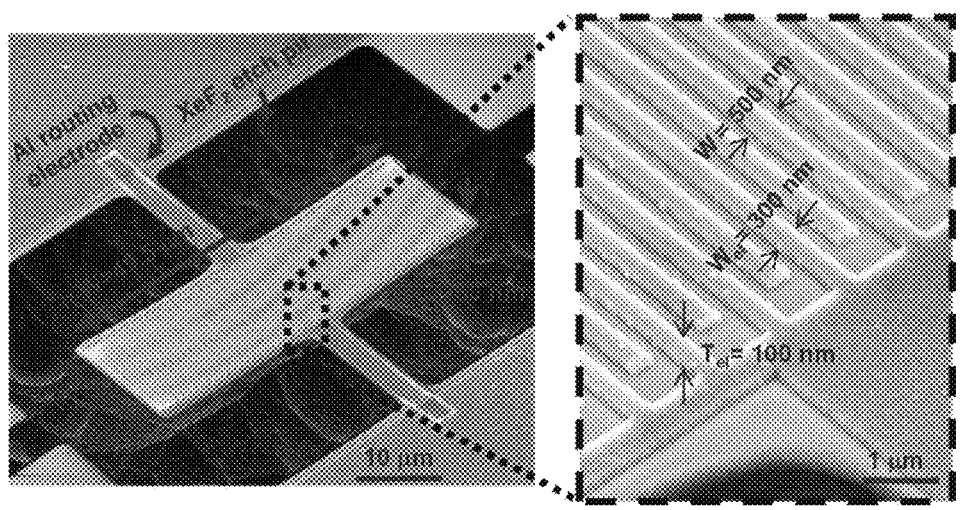
FIG. 25 depicts a SEM picture of a fabricated 9.9 GHz NEMS resonator with a zoomed-in view of a nano-strip array on the NEMS resonator, according to one embodiment.

Referring to FIG. 25, a SEM picture of a fabricated 9.9 GHz NEMS resonator is shown with a zoomed-in view of a nano-strip array. The nano-strip has a pitch of 500 nm; each nano-strip has an electrode width of 300 nm. The thickness of the ultra-thin AlN film of AlN nano-electromechanical resonators is 250 nm. The resonator can operate between 180 MHz and 10 GHz with figure of merit ($k_t^2 \cdot Q$, product of the electromechanical coupling and resonator Q) as high as 20 and $f_0$-Q product as high $5.6 \cdot 10^{12}$ Hz.

To detect multiple VOCs, the surface of each resonant element (CMR-S) needs to be functionalized with different chemically interactive materials (CIMs) capable of selectively adsorbing different gas molecules. The desirable CIM can be characterized by excellent adsorbing properties towards the desired gas species, and does not significantly affect the NEMS resonator performances. Single wall carbon nanotubes (SWNTs) have shown great potentials for chemical sensing. In particular, SWNTs can have some advantages as an adsorbing layer over polymeric films. Due to the unique surface to volume ratio, SWNTs provide the device with a large number of adsorbing sites. Meanwhile, their high acoustic impedance offers a better acoustic match to the resonator and potentially lowers damping. On the other hand, however, pristine carbon nanotubes as a nanosensitive layer is not sufficient to address the problem of selectivity, since SWNTs are sensitive to a broad target of molecules.

Figure 26:
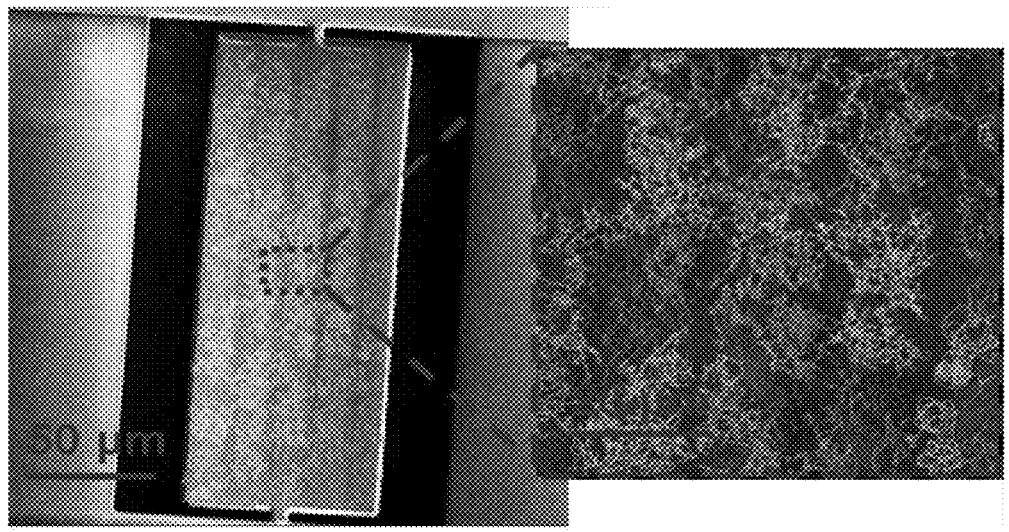
FIG. 26 depicts a SEM picture of single walled carbon nanotubes (SWNTs) grown on an AlN Contour-Mode resonator with a zoomed-in view showing the uniform and dense distribution of SWNTs, according to one embodiment.

According to the embodiments disclosed herein, a nano-bio-coating was formed by decorating SWNTs with single stranded DNA. Two different ss-DNA sequences can be applied to device after nanotubes growth, showing a sequence dependent diversification in the response to 2,6 dinitrotoluene, DNT, an explosive vapor, and DMMP. A large scale integration of SWNTs and CMR-S can be achieved by a process combining top-down microfabrication techniques for the resonators with bottom-up growth for SWNTs (directly grown and patterned on the MEMS chip). The sensor affinity for the adsorption of volatile organic chemicals such as DNT was demonstrated to improve 8 folds when directly functionalizing the top gold electrode of the device with a thiol-terminated single stranded DNA sequence. FIG. 26 depicts a SEM picture of SWNTs grown on AlN Contour-Mode resonator with a zoomed-in view showing the uniform and dense distribution of SWNTs.

Another crucial aspect directly related to the scaling of nanomechanical resonant sensors is the complexity, size and power efficiency of the required sensor read-out. In particular, if the nano-electromechanical resonator can be connected to a self-sustained oscillator loop for direct frequency read-out, design of multiplexed sensor platforms involving large arrays of resonant devices would be significantly simplified. The primary power loss in these oscillator circuits is due to the motional resistance, $R_m$, of the resonator, whose value is inversely proportional to the device figure of merit, $k_t^2 \cdot Q$. Thus, the $k_t^2 \cdot Q$ product of the nanoscaled CMR-S needs to be sufficiently large (>10) for it to connect with a compact and low power self-sustained oscillator circuit for direct frequency read-out.

An ultra-thin-film (250 nm) AlN CMR-S operating up to 1 GHz was fabricated. The nano-scale device demonstrated ultra-high sensitivity to mass loading (256 KHz·µm²/fg) and showed high Q (about 1500 in air) and high $k_t^2$ (about 2%) that would enable direct wire-bonding of the nanoscaled CMR-S to a Pierce oscillator circuit chip fabricated in the ON Semiconductor 0.5 µm CMOS process. The fabricated oscillators showed power consumption as low as 501 µW. The CMR-S were functionalized with a ss-DNA sequence and exposed to DNT vapor. A concentration of DNT as low as 1.5 ppb was detected by the fabricated nano-scale CMR-S. In order to estimate the noise limited minimum frequency shift detectable by the sensor read-out ($\Delta f_{min}$), the short term frequency stability of the oscillator output signal was characterized by measuring its Allan variance. The minimum value of Allan variance detected was approximately 20 Hz and it lasted for a measurement time, τ, of 100 ms. Therefore, considering a minimum detectable frequency shift, $\Delta f_{min}$, of 20 Hz, an estimated limit of detection of mass per unit area would be about 481 zg/µm², which translates to an extrapolated limit of detection for DNT concentrations of about 15 part per trillion (ppt).

The Nano-scale AlN Contour Mode Resonator (N-CMR) technology disclosed herein enables the fabrication of high performance frequency control devices operating in the Super High Frequency band (SHF). Due to the compact form factor and the IC integration capability, N-CMR can be employed for the next generation of RF front-end to replace surface acoustic wave (SAW) devices.

Figure 27:
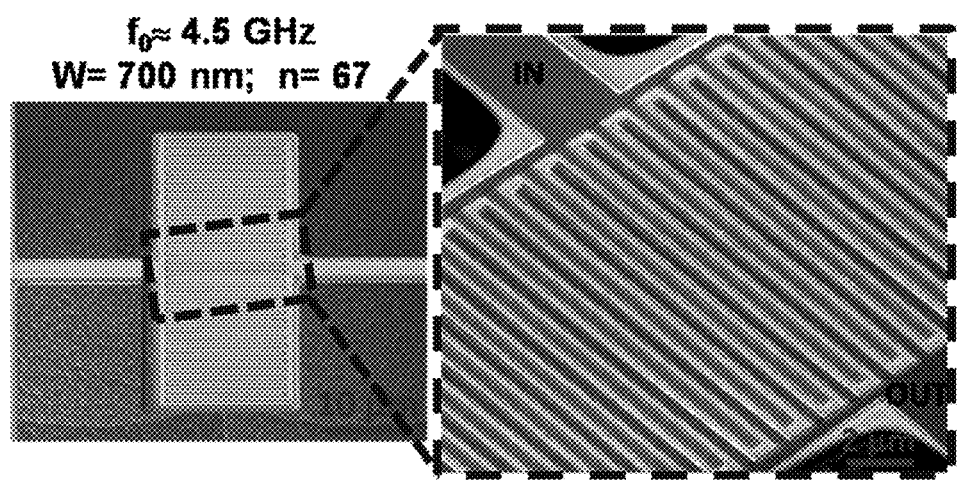
FIG. 27 depicts an SEM picture of the fabricated 4.5 GHz 2-port contour-mode resonator (CMR) with a zoomed in view showing a metallization ratio (ratio of metal electrode to AlN surface) of about 75%.

A 2-port N-CMRs was designed which can operate at a resonance frequency as high as 4.5 GHz. The device dimension was scaled both in the lateral and vertical directions and a TFE scheme was employed to excite a higher-order contour-extensional mode of vibration in nano-features of an ultra-thin-film (250 nm) AlN. The configuration of the N-CMR device as a 2-port network enabled the direct synthesis of the first prototype of SHF filters based on N-CMR technology. For this purpose, 2 resonator stages were electrically cascaded in series to form narrow band filters operating at a frequency as high as 3.7 GHz. The coupling technique is based on the use of the intrinsic capacitance of a 2-port device and permits the definition of band pass filters by employing same frequency resonators. This is different from conventional ladder configurations, which require two different frequency devices and have an associated negative impact on filter yields. The effect of frequency scaling on power handling was experimentally analyzed and a value of critical power density of approximately 5.96 µW/µm³ was detected for a fabricated 3 GHz N-CMR. This value shows that at least one order of magnitude improvement in power handling can be obtained by moving the N-CMR technology from megahertz to gigahertz frequencies. FIG. 27 depicts an SEM picture of the fabricated 4.5-GHz 2-port N-CMR. The metallization ratio (ratio of metal electrode to AlN surface) is 75%.

Additional Notes

The various embodiments herein may be combined. For example, a radiation detector may include a resonator with a 2D electrically conductive material or combined mode resonator.

All literature and similar material cited in this application, including, but not limited to, patents, patent applications, articles, books, treatises, and web pages, regardless of the format of such literature and similar materials, are expressly incorporated by reference in their entirety. In the event that one or more of the incorporated literature and similar materials differs from or contradicts this application, including but not limited to defined terms, term usage, described techniques, or the like, this application controls.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one." Any ranges cited herein are inclusive.

The terms "substantially" and "about" used throughout this Specification are used to describe and account for small fluctuations. For example, they may refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" may refer, according to one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of" or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") may refer, according to one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein "at %" refers to atomic percent and "wt %" refers to weight percent. However, in certain embodiments when "at %" is utilized the values described may also describe "wt %." For example, if "20 at %" is described according to one embodiment, in other embodiments the same description may refer to "20 wt %." As a result, all "at %" values should be understood to also refer to "wt %" in some instances, and all "wt %" values should be understood to refer to "at %" in some instances.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed:

1. A resonator comprising:
  a piezoelectric plate having a length direction, a width direction, and a thickness direction; and
  a first interdigitated electrode including a plurality of conductive strips disposed over a top surface of the piezoelectric plate, wherein the top surface extends along the length direction and the width direction, wherein each conductive strip has an electrode width substantially along the width direction, and wherein the plurality conductive strips are arranged with a pitch substantially along the width direction,
  wherein a two-dimensional mode of mechanical vibration is excited in a cross sectional plane of the piezoelectric plate in response to an alternating voltage applied through the first interdigitated electrode, and wherein the cross sectional plane extends along the width direction and the thickness direction.

2. The resonator of claim 1, wherein the two-dimensional mode of mechanical vibration is a cross-sectional Lamé mode of vibration in which a peak-to-peak displacement along the width direction is the same as a peak-to-peak displacement along the thickness direction.

3. The resonator of claim 2, wherein a ratio of the pitch to a thickness of the piezoelectric satisfies:

$$\frac{p}{T_{AlN}} = \sqrt{\frac{(C_{11} - C_{55})}{(C_{33} - C_{55})}},$$

wherein p is the pitch, $T_{AlN}$ is the thickness of the piezoelectric plate, and $C_{ij}$ are components of a stiffness matrix of the piezoelectric plate.

4. The resonator of claim 1, wherein the two-dimensional mode of mechanical vibration is a degenerate cross-sectional Lamé mode of vibration in which a peak-to-peak displacement along the width direction is different from a peak-to-peak displacement along the thickness direction.

5. The resonator of claim 1, further comprising a second interdigitated electrode including a plurality of conductive strips disposed over a bottom surface of the piezoelectric plate, wherein the bottom surface extends along the length direction and the width direction, wherein the two-dimensional mode of mechanical vibration is excited in the cross sectional plane in response to the alternating voltage applied through the first interdigitated electrode and the second interdigitated electrode.

6. The resonator of claim 1, wherein the piezoelectric plate includes at least one of aluminum nitride, lithium niobate, lithium tantalate, zinc oxide, gallium nitride, scandium nitride, and quartz.

7. The resonator of claim 1, wherein a thickness of the piezoelectric plate is in a range of about 50 nm to about 100 μm.

8. The resonator of claim 1, wherein the pitch is in a range of about 50 nm to about 100 μm.

9. The resonance of claim 1, wherein a ratio of the electrode width to the pitch is so configured as to achieve a maximum electromechanical coupling coefficient for the resonator.

10. The resonator of claim 1, wherein a frequency of the two-dimensional mechanical mode of vibration is in a range of about 1 MHz to about 100 GHz.

11. The resonator of claim 1, wherein the first interdigitated electrode is not in direct contact with the top surface of the piezoelectric plate.

12. The resonator of claim 11, further comprising a temperature compensation layer disposed between the first interdigitated electrode and the top surface of the piezoelectric plate.

13. A infrared (IR) detector comprising:
a plasmonic piezoelectric resonator comprising:
an piezoelectric plate;
an interdigitated electrode including a plurality of conductive strips disposed over a bottom surface of the piezoelectric plate, wherein the plurality of conductive strips are arranged with a pitch; and
a nanoplasmonic metasurface disposed over a top surface of the piezoelectric plate, wherein the nanoplasmonic metasurface has a pattern arranged to facilitate selective absorption of infrared (IR).

14. The IR detector of claim 13, further comprising two tethers supporting the plasmonic piezoelectric resonator and electrically connecting to the interdigitated electrode.

15. The IR detector of claim 13, wherein the piezoelectric plate includes at least one of aluminum nitride (AlN), gallium nitride (GaN), zinc oxide (ZnO), quartz, lithium niobate, and lithium tantalite.

16. The IR detector of claim 13, wherein a thickness of the piezoelectric plate is in a range of about 10 nm to about 6 μm.

17. The IR detector of claim 13, wherein a mode of mechanical vibration is excited in the piezoelectric plate in response to an alternating voltage applied through the first interdigitated electrode.

18. The IR detector of claim 17, wherein a frequency of the mode of mechanical vibration shifts in response to absorption of the infrared (IR) by the piezoelectric plate.

19. The plasmonic piezoelectric resonator of claim 13, wherein the pattern of the nanoplasmonic metasurface includes a plurality of unit cells.

20. A gravimetric sensor comprising:
a nano-scale resonator comprising:
a piezoelectric nano-plate with a thickness in a range of about 10 nm to about 6 μm; and
a first interdigitated electrode disposed over a top surface of the piezoelectric nano-plate, the first interdigitated electrode including a plurality of nano-strips arranged with a pitch in a range of about 10 nm to about 6 μm,
wherein a two dimensional mode of mechanical vibration is excited in the piezoelectric nano-plate in response to an alternating voltage applied through the first interdigitated electrode, and wherein a resonance frequency of the vibration shifts in response to mass loaded on the piezoelectric nano-plate.

21. The gravimetric sensor of claim 20, further comprising single walled carbon nanotubes (SWNTs) grown on the nano-scale resonator.

22. The gravimetric sensor of claim 21, wherein the SWNTs are decorated with single stranded DNAs.

23. The gravimetric sensor of claim 21, further comprising a two dimensional material disposed on the top surface of the piezoelectric nano-plate.

24. The gravimetric sensor of claim 23, wherein the two dimensional material includes at least one of graphene and molybdenum disulfide.

25. The gravimetric sensor of claim 20, further comprising a second interdigitated electrode including a plurality of conductive strips disposed over a bottom surface of the piezoelectric nano-plate, wherein the two-dimensional mode of mechanical vibration is excited in response to the alternating voltage applied through the first interdigitated electrode and the second interdigitated electrode.

* * * * *